(12) United States Patent
Komagino et al.

(10) Patent No.: US 11,173,567 B2
(45) Date of Patent: Nov. 16, 2021

(54) BONDING APPARATUS WITH ROTATING BONDING STAGE

(71) Applicant: KAIJO CORPORATION, Hamura (JP)

(72) Inventors: Yuji Komagino, Tokyo (JP); Hodaka Yamaguchi, Tokyo (JP); Hideki Yoshino, Tokyo (JP)

(73) Assignee: KAIJO CORPORATION

( * ) Notice: Subject to any disclaimer, the term of this patent is extended or adjusted under 35 U.S.C. 154(b) by 222 days.

(21) Appl. No.: 15/776,639

(22) PCT Filed: Feb. 22, 2017

(86) PCT No.: PCT/JP2017/006583
§ 371 (c)(1),
(2) Date: May 16, 2018

(87) PCT Pub. No.: WO2017/208525
PCT Pub. Date: Dec. 7, 2017

(65) Prior Publication Data
US 2018/0326531 A1   Nov. 15, 2018

(30) Foreign Application Priority Data

Jun. 2, 2016   (JP) .............................. JP2016-110973

(51) Int. Cl.
*B23K 20/10* (2006.01)
*B23K 20/26* (2006.01)
(Continued)

(52) U.S. Cl.
CPC .............. *B23K 20/10* (2013.01); *B23K 20/26* (2013.01); *H01L 24/78* (2013.01); *H01L 24/85* (2013.01);
(Continued)

(58) Field of Classification Search
CPC . H01L 2224/78253; H01L 2224/78343; H01L 2224/78349; H01L 2224/78353;
(Continued)

(56) References Cited

U.S. PATENT DOCUMENTS 2,348,062 A * 5/1944 Faber ................. B23K 37/0452
269/61
4,541,062 A * 9/1985 Kada ...................... B23K 9/032
219/124.34

(Continued)

FOREIGN PATENT DOCUMENTS

| JP | S59-101845 A | 6/1984 |
| JP | H07-186442 A | 7/1995 |

(Continued)

*Primary Examiner* — Erin B Saad
*Assistant Examiner* — Carlos J Gamino
(74) *Attorney, Agent, or Firm* — Harness, Dickey & Pierce, P.L.C.

(57) ABSTRACT

Bonding processing for a plurality of bonding points of different distances with respect to a reference position (origin) of an object to be bonded without changing a moving distance of bonding means is provided. The bonding means, a bonding stage having a work-holder and a rotary mechanism unit for rotating the work-holder, and a control unit for controlling rotation of the work-holder are provided. The bonding means is movable relative to a placement surface of the work-holder in a reference orientation and has a reference position on its moving direction. The plurality of bonding points include bonding points of different separation distances from the reference position along the moving direction while the object to be bonded is being held to the work-holder in the reference orientation. The control unit corrects differences in the separation distances of the plurality of bonding points by controlling rotation of the work-holder.

9 Claims, 24 Drawing Sheets

(51) Int. Cl.
*H01L 23/00* (2006.01)
*B23K 101/40* (2006.01)

(52) U.S. Cl.
CPC .......... *B23K 2101/40* (2018.08); *H01L 24/48* (2013.01); *H01L 24/49* (2013.01); *H01L 2224/78001* (2013.01); *H01L 2224/78251* (2013.01); *H01L 2224/78349* (2013.01); *H01L 2224/78353* (2013.01); *H01L 2224/78802* (2013.01); *H01L 2224/78803* (2013.01); *H01L 2224/78981* (2013.01); *H01L 2224/85205* (2013.01)

(58) Field of Classification Search
CPC ........... H01L 2224/85205; H01L 24/85; H01L 24/78; B23K 37/0452
See application file for complete search history.

(56) References Cited

U.S. PATENT DOCUMENTS

| | | | | |
|---|---|---|---|---|
| 4,759,073 A | * | 7/1988 | Shah | G05B 19/4083 228/103 |
| 4,826,069 A | * | 5/1989 | Chan | H01L 24/78 228/103 |
| 4,890,579 A | * | 1/1990 | Oloff | A01K 15/00 119/722 |
| 5,060,841 A | * | 10/1991 | Oshima | B23K 20/004 228/102 |
| 5,242,103 A | * | 9/1993 | Denvir | H01L 21/67138 228/179.1 |
| 5,465,899 A | * | 11/1995 | Quick | H01L 23/4952 228/180.5 |
| 5,566,876 A | * | 10/1996 | Nishimaki | H01L 24/78 228/102 |
| 6,347,733 B1 | * | 2/2002 | Hickey, II | B23K 37/0452 219/121.82 |
| 6,619,535 B1 | * | 9/2003 | Imanishi | H01L 24/78 228/180.22 |
| 6,808,102 B1 | * | 10/2004 | Ho | B23K 20/004 228/180.5 |
| 7,772,045 B1 | * | 8/2010 | Bindrup | B23K 20/007 438/125 |
| 8,099,184 B2 | * | 1/2012 | Schoening | B23K 20/023 700/114 |
| 8,424,195 B2 | * | 4/2013 | Hwang | H01L 21/67144 29/740 |
| 9,707,651 B2 | * | 7/2017 | Prust | B23Q 1/527 |
| 2001/0026991 A1 | * | 10/2001 | Ichikawa | H01L 24/85 438/411 |
| 2006/0278622 A1 | * | 12/2006 | Inoue | B23K 37/0452 219/125.1 |
| 2008/0246204 A1 | * | 10/2008 | Wilkinson | B23Q 1/5412 269/61 |
| 2010/0059574 A1 | * | 3/2010 | Arahata | H01L 24/48 228/180.5 |
| 2013/0256385 A1 | * | 10/2013 | Sugito | H01L 24/78 228/10 |

FOREIGN PATENT DOCUMENTS

| | | | |
|---|---|---|---|
| JP | 08008287 A | * 1/1996 | ............ H01L 24/78 |
| JP | H08-8287 A | 1/1996 | |
| JP | 2001-267674 A | 9/2001 | |
| JP | 2012-237751 A | 12/2012 | |

* cited by examiner

BONDING APPARATUS WITH ROTATING BONDING STAGE

CROSS-REFERENCE TO RELATED APPLICATIONS

This application is a U.S. National Stage of International Application No. PCT/JP2017/006583, filed on Feb. 22, 2017, and claims priority to Japanese Application No. 2016-110973, filed on Jun. 2, 2016, the entire disclosures of the above applications are incorporated herein by reference.

BACKGROUND

Technical Field

The present invention relates to a bonding apparatus, a bonding method, and a bonding control program for bonding an object to be bonded having three or more bonding faces in different directions by using a wire or the like.

Related Art

Conventionally, known as a bonding apparatus is a wire bonding apparatus which connects an electrode (pad) on an IC chip as a first bonding point with a lead as a second bonding point by using a gold wire, a wire made of copper, or the like.

In the wire bonding apparatus which performs bonding of the pad on the IC chip as the first bonding point with the lead of a lead frame made of a metal, for example, as the second bonding point via a wire, the first bonding point and the second bonding point are located on planes in parallel to each other. In the meantime, in packages of a semiconductor laser, a flat-plate filter, a three-axis sensor, or the like, the first bonding point and the second bonding point may be located on planes that are perpendicular to each other. Therefore, bonding cannot be achieved with the conventional wire bonding apparatus.

JP-S59-101845 discloses an assembling device which is capable of performing first bonding by holding a semiconductor device on a stage and performing second bonding through rotating the stage by 90 degrees after the first bonding when assembling the semiconductor device such as a laser diode or the like having a first bonding face and a second bonding face substantially orthogonal to the first bonding face. This makes it possible to perform bonding of the first bonding face and the second bonding face through rotating the stage by 90 degrees even when the second bonding face is substantially orthogonal to the first bonding face, so that mass-production of the semiconductor devices can be achieved.

Meanwhile, JP-H8-8287 discloses a wire bonding apparatus which performs a plurality of times of wire bonding between a pad and a lead placed on faces which are perpendicular to each other without re-detaching the work. According to JP-H8-8287, a capillary is lifted up after performing first bonding of the wire on a face in parallel to a stage by the capillary. Then, the stage is rotated by 90 degrees with respect to an axis in parallel to the stage going through the inversion center of the stage and, after the rotation, second bonding of the wire to the face perpendicular to the stage of the work is performed by the capillary. After the second bonding, the capillary is lifted up and set still such that the lower end of the capillary comes at a position in the vicinity of the inversion center. Thereafter, the stage is inversely rotated by 90 degrees with respect to the axis in parallel to the stage going through the inversion center to be returned to the original position.

Then, the stage carrying the work in a horizontal state is rotated by a prescribed angle about the axis perpendicular to the stage so as to have a prescribed position on the work comes under the capillary by the rotation for performing bonding in the perpendicular direction on an opposite face.

Thereby, when performing bonding of the work in both faces in the perpendicular direction as in a case of a flat-plate filter, bonding on the opposite face in the perpendicular direction can be performed by rotating the work in a horizontal state along with the stage after bonding to one of the faces in the perpendicular direction is completed.

Meanwhile, JP-H7-186442 discloses a mounting device of a light-emitting diode array unit, which includes a rotary mechanism in which a sample stage is rotated by 90 degrees with respect to a longitudinal direction and a mechanism that moves the stage in two directions perpendicular to the rotation axis for adjusting the position of the rotation axis in order to connect, via wire bonding, each of the samples in the light-emitting diode array unit in which surface light-emitting type diode arrays are mounted perpendicularly or substantially perpendicularly with respect to a base face for mounting a drive IC or the like.

Further, JP-2012-237751 discloses a method and a device related to a three-axis sensor chip package. According to JP-2012-237751, the sensor package includes: a base; and a first sensor die attached to the base, which includes a first active sensor circuit and a plurality of metal pads electrically coupled to the first active sensor circuit. Also, a second sensor die attached to the base includes: a second active sensor circuit disposed on a first surface of the second sensor die; and a plurality of second metal pads electrically bonded to the second active sensor circuit on a second surface of the second sensor die. The second active sensor circuit is located orthogonal with respect to the first active sensor circuit, and the second sensor die is disposed to be perpendicular to the base. The second surface of the second sensor die is provided to be adjacent to the first surface with an angle with respect to the first surface. The three-axis sensor chip package is coupled by wire bonding which mutually connects the plurality of first metal pads of the first sensor die with the plurality of second metal pads of the second sensor die.

As described above, the inventions disclosed in JP-S59-101845, JP-H8-8287, JP-H7-186442 and JP-2012-237751 are designed on assumption that height positions of a plurality of bonding sections of an object to be bonded are aligned to be the same, so that a moving distance of bonding means for the bonding sections is set as a common moving distance.

Recently, chips of semiconductor lasers or the like have been developed. In such types of semiconductor laser chips, heights of bonding sections vary. When bonding processing is to be executed on the bonding sections of such type of semiconductor laser by the existing bonding apparatuses disclosed in JP-S59-101845, JP-H8-8287, JP-H7-186442 and JP-2012-237751, the bonding processing by using the bonding means cannot be executed depending on the heights of the bonding sections since the moving stroke of the bonding means is set in common for the plurality of bonding sections of different heights. Therefore, it is desired to develop a bonding apparatus that is capable of effectively performing such bonding processing on the chips of the semiconductor lasers or the like.

Further, the semiconductor laser chip may have a plurality of bonding sections of different heights disposed in three or more faces of the chip in some cases. Therefore, it is desired to develop a bonding apparatus capable of effectively performing the bonding processing by the bonding means on the plurality of bonding sections of different heights disposed on the three or more faces without complicating the mechanism of the bonding apparatus.

It is therefore an object of the present invention to provide a bonding apparatus for performing the bonding processing on the plurality of bonding sections of different distances with respect to a reference (origin) position of an object to be bonded without changing the moving distance of the bonding means in order to meet such demand for enabling effective bonding processing performed on the plurality of bonding sections of different heights by the bonding means without complicating the mechanism of the bonding apparatus.

SUMMARY OF THE INVENTION

The bonding apparatus according to the present invention includes: bonding means which performs bonding of a plurality bonding points of an object to be bonded; a bonding stage including a work-holder which is in a reference orientation directly facing the bonding means and holds the object to be bonded on its placement surface, and a rotary mechanism unit for rotating the work-holder about a rotation axis from the reference orientation; and a control unit which controls rotation of the work-holder, wherein the bonding means is provided to be movable with respect to the placement surface of the work-holder in the reference orientation and has a reference position to be a moving reference of the bonding means on its moving direction, the plurality of bonding points include bonding points of different separation distances from the reference position along the moving direction in a state where the object to be bonded is being held to the work-holder in the reference orientation, and the control unit corrects a difference between the separation distances of the plurality of bonding points by controlling rotation of the work-holder in accordance with the difference in the separation distances of each of the bonding points.

Further, the rotary mechanism unit of the bonding apparatus according to the present invention is configured to be capable of rotating the work-holder in the reference orientation in forward and reverse directions about the rotation axis.

Further, the bonding stage of the bonding apparatus according to the present invention includes a heat plate capable of placing the object to be bonded and a heat block capable of heating the heat plate, and the heat plate includes distance correction means which brings the object to be bonded closer or away with respect to the reference position in a state where the object to be bonded is placed on the work-holder in the reference orientation.

Further, the heat plate and the heat block of the bonding apparatus according to the present invention are configured separately.

Furthermore, the bonding apparatus according to the present invention includes: ultrasonic generation means capable of applying ultrasonic vibration, which is provided to the bonding means; and torque generation means which gives a torque to the rotation axis for suppressing vibration caused by the ultrasonic generation means.

Further, the object to be bonded of the bonding apparatus according to the present invention is provided near the rotation axis of the bonding stage.

Further, the rotary mechanism unit of the bonding stage of the bonding apparatus according to the present invention is configured to be located on a lower side than the rotation axis so as to provide a wide movable range for a bonding head so that the bonding head as the bonding means advances onto the bonding faces on an upper side.

Further, the bonding method according to the present invention is a bonding method for performing bonding of bonding points of an object to be bonded placed on a placement surface of a work-holder of a bonding stage by using bonding means, and the method includes correcting a difference between separation distances of the plurality of bonding points by controlling rotation of the work-holder in accordance with the difference in the separation distances of each of the bonding points, wherein: the work-holder is rotatable about a rotation axis from a reference orientation that is directly facing the bonding means, the bonding means is provided to be movable with respect to the placement surface of the work-holder in the reference orientation, and a reference position to be a moving reference of the bonding means is set on a moving direction thereof; and the bonding points include a plurality of bonding points of different separation distances from the reference position along the moving direction in a state where the object to be bonded is being held to the work-holder in the reference orientation.

Further, the bonding control program according to the present invention is a bonding control program configured to control bonding processing by using bonding means on bonding points of an object to be bonded placed on a placement surface of a work-holder of a bonding stage, and the bonding control program causes a computer to execute: a function of setting a reference position to be a moving reference of the bonding means on a moving direction of the bonding means; and a function of correcting a difference between separation distances of a plurality of bonding points by controlling rotation of the work-holder in accordance with the difference in the separation distances of each of the bonding points, wherein the work-holder is rotatable about a rotation axis from a reference orientation that is directly facing the bonding means, the bonding means is provided to be movable with respect to the placement surface of the work-holder in the reference orientation, and the bonding points include a plurality of bonding points of different separation distances from the reference position along the moving direction in a state where the object to be bonded is being held to the work-holder in the reference orientation.

Advantageous Effects of Invention

As described above, the present invention is capable of performing bonding processing on the plurality of bonding sections of different separation distances with respect to the reference (origin) position of the object to be bonded without changing the moving distance of the bonding means through correcting the separation distances of the bonding sections of the object to be bonded with respect to the bonding means by rotating the bonding stage about the rotation axis.

In the present invention, the bonding stage is rotated about the rotation axis. Thus, when performing bonding processing by the bonding means, the orientation of the bonding stage with respect to the bonding means is expected to become an issue. Therefore, the present invention utilizes the rotary mechanism for rotating the bonding stage to apply a torque to the bonding stage for enabling stabilization of the orientation for bonding.

Further, through employing a simple mechanism that rotates the bonding stage without changing the moving distance of the bonding means, the present invention is not only capable of performing the bonding processing on a plurality of bonding sections of different heights without complicating the mechanism of the bonding apparatus but also capable of effectively performing bonding processing on the plurality of bonding sections of different heights disposed on three or more faces even when the plurality of bonding sections of different heights are disposed on the three or more faces of a chip.

Further, for bonding the object to be bonded having bonding faces in a flat face in a reference orientation and an opposing face perpendicular to the flat face, conventionally performed are bonding on one of the opposing faces, repositioning of the object to be bonded to a state rotated by 180 degrees by an operator, and then bonding on the other opposing face by rotating an inversion mechanism. The present invention, however, requires no such repositioning by the operator for performing bonding of the other opposing face when bonding the object to be bonded having the flat face and the opposing face perpendicular to the flat face, so that the operation efficiency is improved and the productivity can be increased. That is, the present invention is configured to provide a wide movable range of the bonding head by locating the bonding stage having the rotary mechanism unit on a lower side as much as possible for allowing the bonding head to advance onto the bonding face from the upper side thereof so that the bonding can be performed while the object to be bonded is rotated by 180 degrees. This makes possible to easily perform bonding with the bonding head of a wide movable range on the object to be bonded having three or more bonding faces in different directions, i.e., the object to be bonded having electrodes of different separation distances of the bonding positions to be bonded within the face.

In the present invention, the work-holder is configured to be rotatable about the rotation axis from the reference orientation that is directly facing the bonding means, the bonding means is provided to be movable with respect to a placement surface of the work-holder in the reference orientation, and the reference position to be the moving reference of the bonding means is set on the moving direction. As the moving direction of the bonding means, assumed is the vertical direction (Z-direction) along which the bonding means moves.

In the present invention, it is supposed that the bonding points include a plurality of bonding points of different separation distances from the reference position along the moving direction in a state where the object to be bonded is being held to the work-holder in the reference orientation, and a difference between the separation distances of the plurality of bonding points is corrected by controlling rotation of the work-holder in accordance with the difference between the separation distances of each of the bonding points.

Accordingly, the bonding positions in the present invention indicate the bonding points of different separation distances from the reference position along the moving direction in the state where the object to be bonded is being held to the work-holder in the reference orientation. Further, "distances" depicted in FIG. 5, FIG. 6, FIG. 8, FIG. 10, FIG. 13, FIG. 14, FIG. 15, and FIG. 17 means "separation distances".

Further, unlike the conventional bonding apparatus, the bonding apparatus for bonding the object to be bonded having three or more bonding faces in different directions moves not only the bonding head but also the stage side relatively, so that stabilization of the bonding positions is required. Thus, it is necessary to set the placing position of the object to be bonded in the vicinity of the rotation axis and also to suppress vibration of the rotary mechanism unit. The bonding apparatus of the present invention applies a large torque to the rotation axis to stabilize the rotary mechanism unit and suppress vibration for enabling stable bonding. Therefore, it is possible to set the placing position of the object to be bonded in the vicinity of the rotation axis and to suppress vibration of the rotary mechanism unit.

DETAILED DESCRIPTION OF THE PREFERRED EMBODIMENTS

Figure 1:
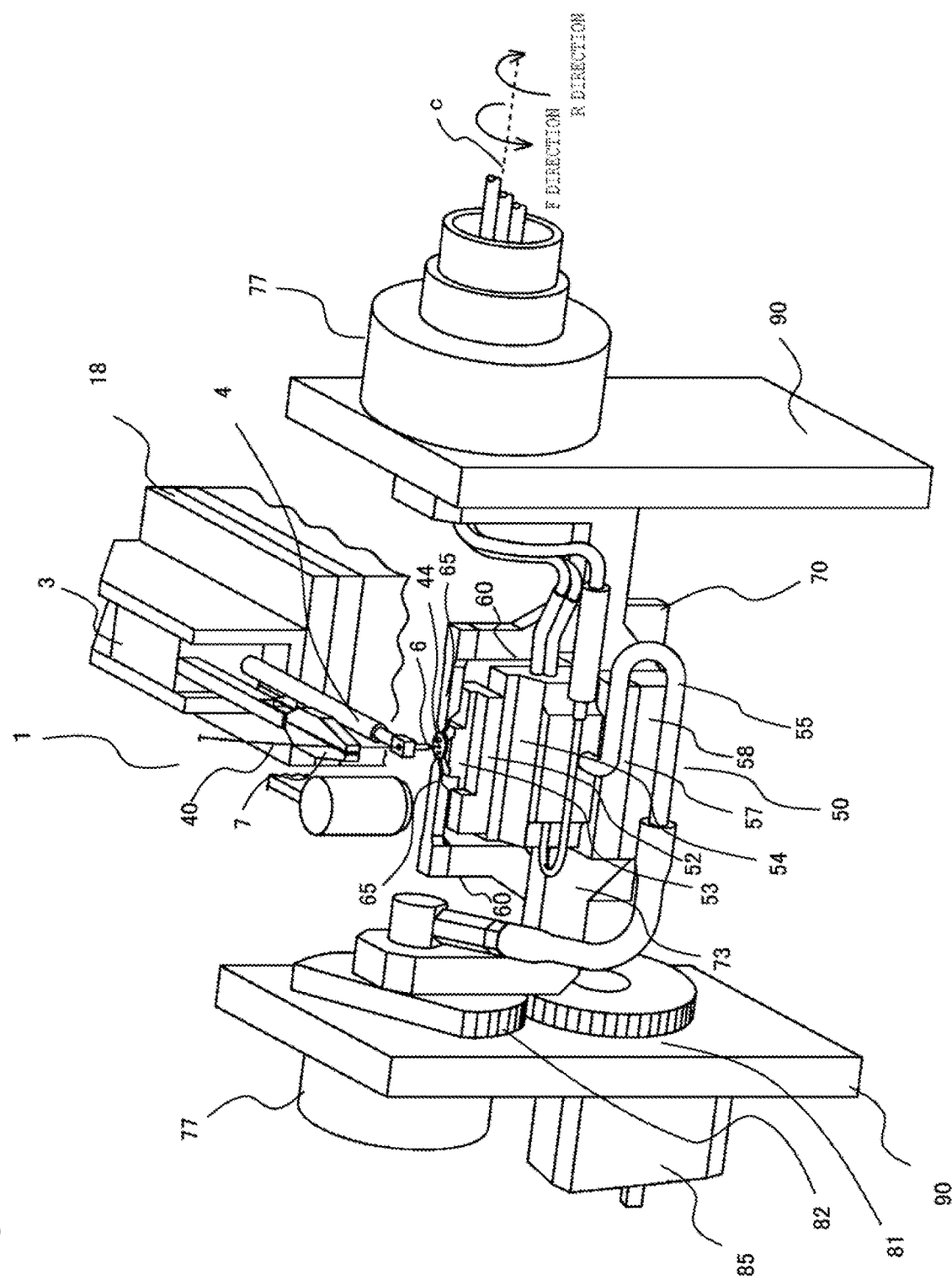
FIG. 1 is a perspective view showing structures of a wire bonding apparatus as the bonding apparatus of the present invention.

Hereinafter, embodiments of the bonding apparatus and the bonding method according to the present invention will be described by referring to the drawings. In the explanations below, a wire bonding apparatus which connects electrodes of an object to be bonded and a lead by using a wire is used for describing the bonding apparatus.

The present invention enables bonding by correcting a difference in separation distances of bonding positions of a plurality of bonding points with respect to a bonding head through controlling rotation of a work-holder in accordance with the difference in the separation distances of the bonding positions of the bonding object with respect to the bonding head as a bonding means. Further, the present invention also enables bonding by correcting the difference in the separation distances of the bonding positions when the distances on the bonding faces vary through controlling a rotary mechanism unit 70 (shown in FIG. 3) such that relative positions of the bonding faces of the object to be bonded of a semiconductor laser package or the like having three of more bonding faces in different directions with respect to the bonding tool come to be located directly above the bonding tool. This makes it possible to perform bonding of the semiconductor laser packages or the like having three or more bonding faces in different directions, so that the productivity can be improved remarkably.

Figure 2:
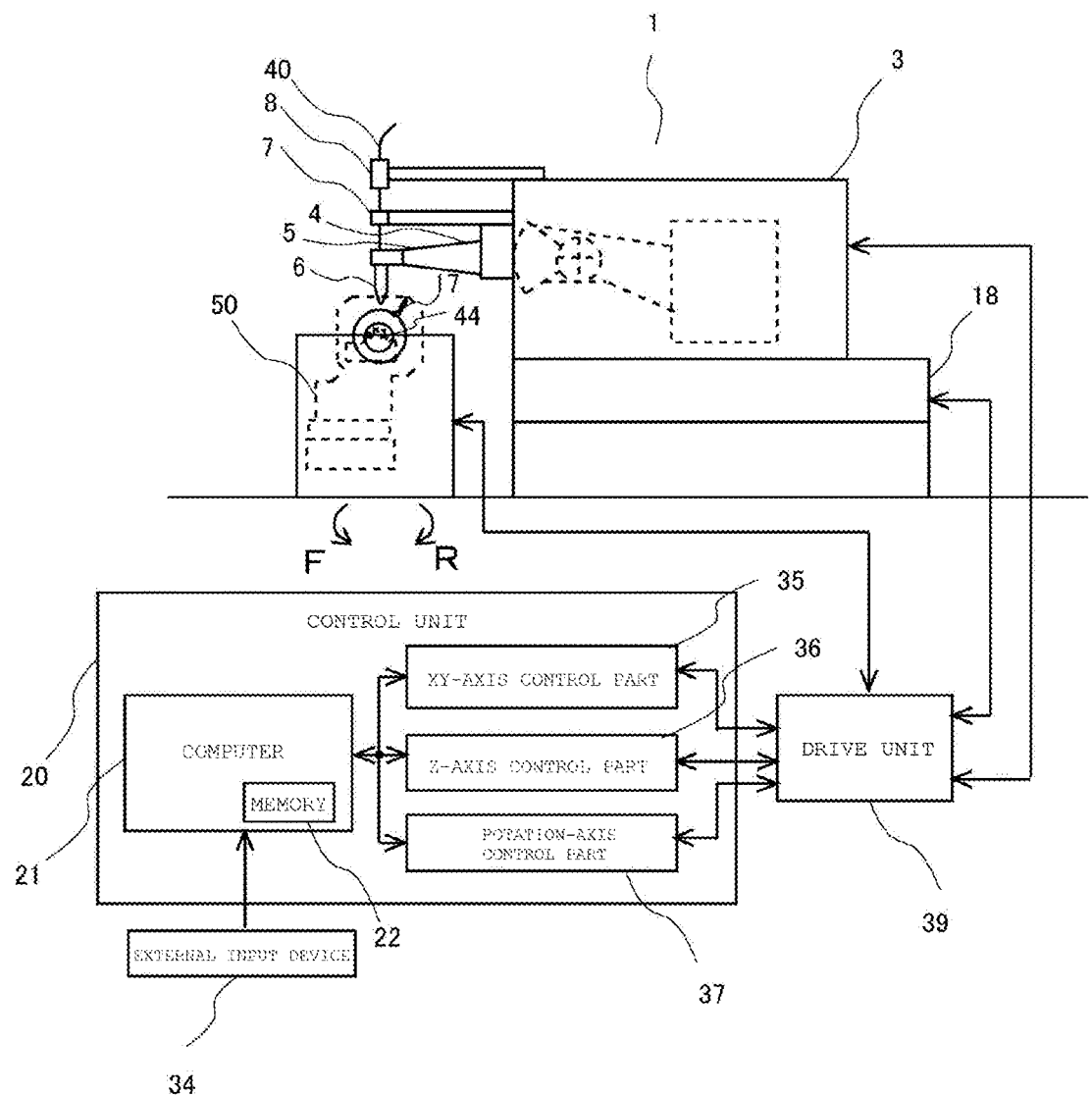
FIG. 2 is a block diagram showing structures of a control unit and a drive unit of the wire bonding apparatus as the bonding apparatus of the present invention.
Figure 3:
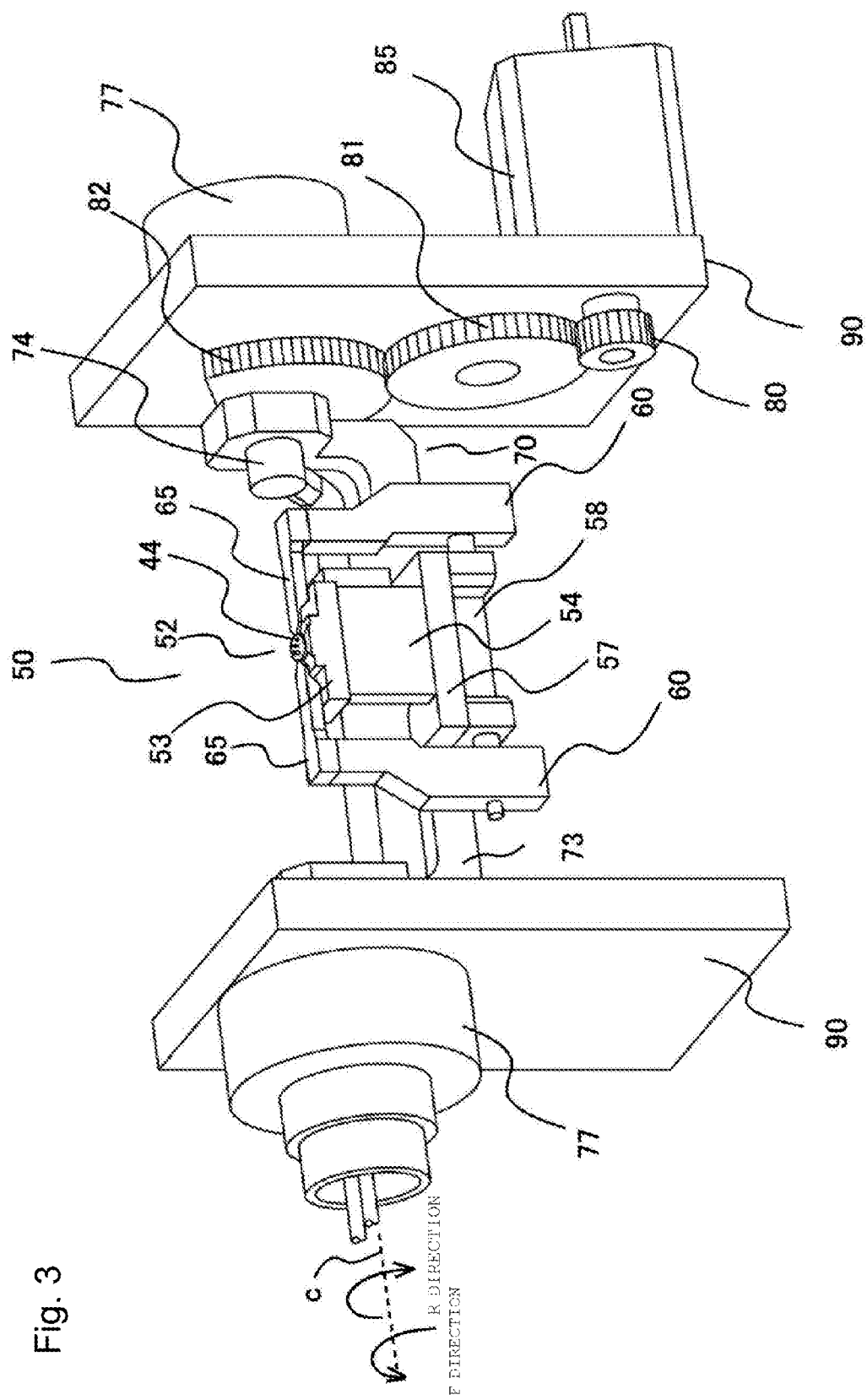
FIG. 3 is a perspective view showing structures of a bonding stage of the wire bonding apparatus as the bonding apparatus of the present invention.
Figure 4:
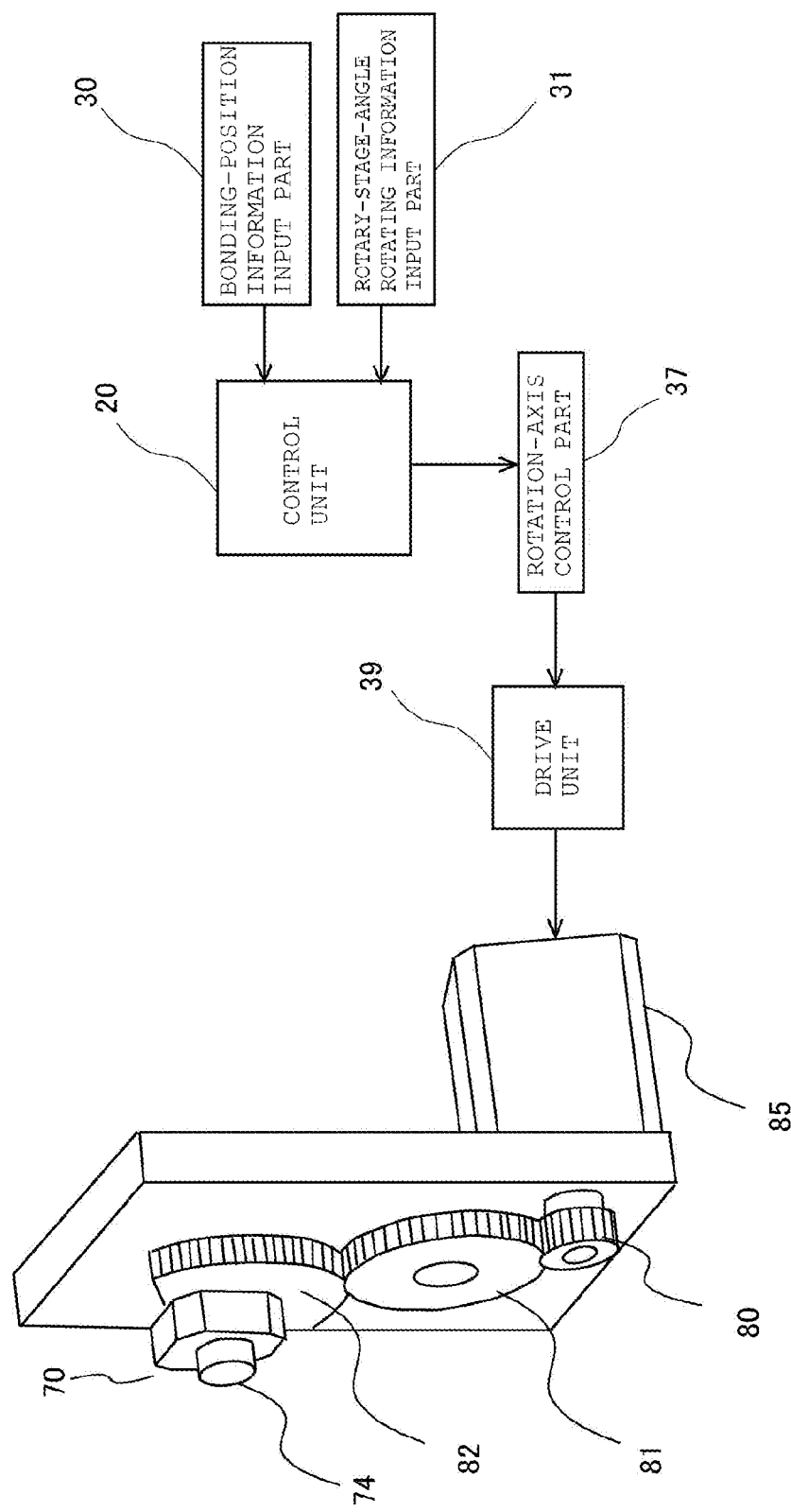
FIG. 4 is a block diagram showing structures of the control unit and the drive unit of a rotary mechanism unit.

Structures of the wire bonding apparatus as the bonding apparatus of the present invention will be described by referring to FIG. 1 to FIG. 4. FIG. 1 is a perspective view showing the structures of the wire bonding apparatus as the bonding apparatus of the present invention. FIG. 2 is a block diagram showing structures of a control unit and a drive unit of the wire bonding apparatus as the bonding apparatus of the present invention, FIG. 3 is a perspective view showing structures of a bonding stage (a bonding rotary stage) of the wire bonding apparatus as the bonding apparatus of the present invention, and FIG. 4 is a block diagram showing structures of the control unit and the drive unit of the rotary mechanism unit. As shown in FIG. 1 and FIG. 2, a wire bonding apparatus 1 includes: a bonding head 3; an XY stage 18 as a positioning means which has the bonding head 3 placed thereon and two-dimensionally moves in X-direction and/or Y-direction for setting the position; and a bonding stage (a bonding rotary stage) 50 on which an object to be bonded 44 having a semiconductor laser chip or the like mounted thereon is placed for performing bonding work by a bonding tool 6. Further, as shown in FIG. 2, the control unit and the drive unit of the wire bonding apparatus 1 are configured with: a control unit 20 including a computer 21, an XY-axis control part 35, a Z-axis control part 36, and a rotation-axis control part 37; and a drive unit 39 which transmits drive signals to each motor of the XY stage 18, the bonding head 3, and the bonding stage (the bonding rotary stage) 50 according to command signals from the XY-axis control part 35, the Z-axis control part 36, and the rotation-axis control part 37. Under the control of the computer 21, the XY-axis control part 35 generates and outputs a command signal for controlling the XY-axes position of the XY stage 18 to the drive unit 39, the Z-axis control part 36 generates and outputs a command signal for controlling the Z-axis position of the bonding head 3 to the drive unit 39, and the rotation-axis control part 37 generates and outputs a command signal for controlling rotation of the rotation-axis of the bonding stage (the bonding rotary stage) 50 to the drive unit 39. The bonding stage 50 is configured to be able to perform bonding work by rotating the object to be bonded, so that the bonding stage 50 will be expressed as the bonding rotary stage 50 in the explanations below.

The bonding head 3 as the bonding means includes: an ultrasonic transducer (not shown); an ultrasonic horn 5 having a capillary 6 as the bonding tool 6 on one leading end thereof; a bonding arm 4 having the other side joined with a shaft (not shown); an encoder (not shown) as a position detection means which detects the position of the capillary 6; and a linear motor (not shown) which drives the bonding arm 4 vertically about the shaft. Note that the ultrasonic transducer and the ultrasonic horn 5 form an ultrasonic wave generation means. Further, the motor for driving the bonding arm 4 is not limited to a linear motor but other types of motors may be employed as well.

Further, as shown in FIG. 1 and FIG. 2, the bonding head 3 includes: a clamp 7 (clamping means) which clamps a wire 40 and operates vertical movement and an open/close mechanism by associating with the capillary 6 while being fixed to the bonding arm 4; and a tension clamp 8 (shown in FIG. 2) which applies tension by blowing a gaseous matter to the wire 40 extended in the perpendicular direction via the capillary 6 and the clamp 7. Unlike the clamp 7, the tension clamp 8 located above the clamp 7 does not associate with the capillary 6 and is fixed to the bonding head 3. The open/close mechanism of the clamp 7 for clamping the wire 40 and the tension clamp 8 are controlled by the control unit 20 via the drive unit 39.

Further, as shown in FIG. 2, the bonding head 3 includes a discharge electrode 17 for forming a ball at the leading end of the capillary 6 by fusing the wire 40 by discharging electricity.

As shown in FIG. 2, the control unit 20 includes a built-in computer 21 having a CPU, not shown, a memory 22, an input/output part, not shown, etc. The CPU of the computer 21 controls the bonding apparatus 1 by executing a program stored in the memory 22. The memory 22 of the computer 21 can also store data and the like other than the program.

The memory 22 of the computer 21 stores a bonding control program for controlling bonding processing executed by the bonding means on the bonding points of the object to be bonded being placed on the placement surface of the work-holder of the bonding stage. The bonding control program according to the present invention is a program for causing the computer to execute a function of setting a reference position to be a moving reference of the bonding means on the moving direction of the bonding means and a function of correcting a difference in the separation distances of the plurality of bonding points by controlling rotation of the work-holder in accordance with the difference in the separation distances of each of the bonding points, supposing that: the work-holder 52 is rotatable about the rotation axis from the reference orientation facing the bonding means; the bonding means is provided to be movable with respect to the placement surface of the work-holder 52 in the reference orientation; and the bonding points include the plurality of bonding points of different separation distances from the reference position along the moving direction while the object to be bonded is being held to the work-holder in the reference orientation. This bonding control program is stored in the memory 22. The CPU of the computer 21 controls actions of the bonding apparatus of the present invention by reading out the bonding control program stored in the memory 22, and executes the bonding method of the present invention by controlling the bonding apparatus.

Further, an external input device 34 such as a keyboard is connected to the computer 21 for storing a vertical moving amount of the capillary 6, XY-axis coordinates of the bonding points on the XY stage 18, rotation data of the rotary mechanism unit 70 of the work-holder 52 and the like inputted via the external input device 34 are to be stored in the memory 22. Note that the bonding points are positions to be bonded in the electrodes, terminals, and the like.

The position of the capillary 6 in bonding is shown by the distance in the Z-axis (perpendicular) direction from the origin position of the capillary 6. The origin position of the capillary 6 is the position of the capillary 6 when the origin is detected by the encoder. For example, the position of the capillary 6 when a ball located at a leading end of the capillary 6 abuts against the bonding point corresponds to the distance in the perpendicular direction from the origin position of the capillary 6 when abutting. The origin position of the capillary 6 is set in advance. The origin position of the capillary 6 in the explanations hereinafter is expressed as the origin o. Further, the origin position of the capillary 6 may be set as different for different faces of the object to be bonded.

Further, a region on XYZ-axes capable of being bonded by moving the bonding tool 6 such as the capillary 6 is called a bondable region. The bondable region on the XY-axes is defined by a movable range of the XY stage 18, and the bondable region on the Z-axis is defined by a movable range of the bonding tool 6. As will be described later, the movable range of the bonding tool 6 in the bonding apparatus according to the present invention is defined to be broad so that bonding can be performed easily on the object to be bonded having three or more bonding faces in different directions.

Hereinafter, described by referring to FIG. 1 and FIG. 3 are the structures of the bonding rotary stage on which the object to be bonded having the three or more bonding faces in different directions is placed for performing bonding. FIG. 3 is a perspective view showing the structures of the bonding rotary stage of the wire bonding apparatus as the bonding apparatus of the present invention.

As shown in FIG. 1 and FIG. 3, the bonding rotary stage 50 includes: the work-holder 52 which holds and heats the object to be bonded 44; the rotary mechanism unit 70 (illustrated on the right side of FIG. 3) which rotates the work-holder 52 with the object to be bonded 44 being placed thereon to the front side or the back side with respect to the position of the object to be bonded 44; and a slide mechanism unit (not shown) which holds and releases the object to be bonded 44 on the work-holder 52.

The work-holder 52 includes: a heat plate 53 for placing and heating the object to be bonded 44; a heat block 54 for heating the heat plate 53; a heat insulation part 57 for insulating the heat; a support part 58 which is provided under the heat insulation part 57 for supporting the heat block 54 and the like; and a work presser 65 for holding the object to be bonded 44. The heat plate 53 and the heat block 54 for heating the heat plate 53 according to the present invention are separately configured. Since the heat plate 53 is separated, it is possible to exchange the heat plate 53.

The heat plate 53 as the placement surface has the object to be bonded 44 placed thereon and heats the object to be bonded 44 by the heat from the heat block 54. In the heat plate 53, there is formed a surface to be closely fitted to the lower part of the object to be bonded 44 so as to transfer the heat efficiently to the object to be bonded 44. Bonding is performed by placing the object to be bonded 44 on the heat plate 53. The heat plate 53 has a distance correction means which corrects the bonding positions of the object to be bonded at different distances to be brought closer or away to/from the position at the distance capable of performing bonding by the bonding head 3 as the bonding means. That is, the distance correction means of the heat plate 53 corrects the separation distance of the bonding position of the object to be bonded for each object to be bonded in the Z-axis direction to be the position at the distance capable of performing bonding by the bonding head 3. As a result, bonding processing can be performed on a plurality of bonding sections of different distances with respect to the reference (origin) position of the object to be bonded without changing the moving distance of the bonding means.

Further, it is also possible to provide an adsorption hole used for vacuum adsorption for adsorption-fixing the object to be bonded 44 in the heat plate 53 as necessary.

Further, the heat plate 53 according to the present invention is configured separately from the heat block 54 so as to be exchanged with the heat plate 53 of different thickness in accordance with the height of the electrode of the object to be bonded 44, for example. It is also possible to provide a mechanism for changing the height position of the surface of the heat plate 53 for allowing automatic adjustment.

Under the heat plate 53, the heat block 54 is provided. A heater is built in the heat block 54, and the heater is controlled such that the heat block 54 keeps a prescribed temperature through detecting the temperature of the heat block 54 by a temperature sensor.

Further, it is also possible to provide an adsorption hole for vacuum adsorption inside the heat block 54. Vacuum adsorption may be performed by connecting the adsorption hole of the heat block 54 with the adsorption hole of the heat plate 53 and by providing a metal tube 55 for vacuum adsorption pipe on the side face of the heat block 54. Through adsorbing the back face of the object to be bonded 44 by the heat plate 53 at the time of bonding, the object to be bonded 44 can be closely fitted and fixed to the heat plate 53.

Under the heat block 54, the heat insulation part 57 made of a heat insulating material is provided. The heat insulation part 57 insulates heat so that the heat from the heat block 54 is not transferred to the parts thereunder.

Further, the support part 58 is provided to the bottom face of the heat insulation part 57. The support part 58 provided under the heat insulation part 57 supports the heat plate 53, the heat block 54, and the heat insulation part 57 located thereabove.

Further, on both left and right ends of the support part 58, support members 60 joined via a spring such as an elastic body are provided. The support members 60 located on both left and right ends of the support part 58 are attached to be rotatable to a U-shaped swing member 73 of the rotary mechanism unit 70.

On upper end faces of the support members 60, ends of a pair of work pressers 65 provided on left and right are fixed. The support members 60 are rotated by the slide mechanism unit (not shown) by having the parts attached to the swing member 73 as the shafts, and the upper leading ends are moved laterally. The work pressers 65 slide laterally to press and fix the object to be bonded 44 on the heat plate 53 or release the fixed state thereof.

Instead of moving the support members 60 laterally, the support members 60 may be moved vertically to move the work presses 65 vertically. Through moving the work pressers 65 to the upper side, the hold of the object to be bonded 44 is released. Through moving down the work pressers 65 from the upper side, a part of the surface of the object to be bonded 44 or the side face thereof is pressed and fixed.

Next, the rotary mechanism unit 70 of the bonding rotary stage 50 will be described. As shown in FIG. 3, the rotary mechanism unit 70 is formed with a bar-like swing member 73 in a substantially U-like shape as a whole, and includes rotation axes 74 (shafts) on both ends of the swing member 73. Further, in the vicinity of the center position of the bar-like swing member 73 in the substantially U-like shape, a flat plate (not shown) for joining and holding the work-holder 52 is provided.

The rotation axes 74 at both ends of the swing member 73 are attached to side plates 90 provided on left and right via bearings 77. Further, the rotation axes 74 at both ends are provided such that a virtual line (center line) connecting the centers of the rotation axes 74 is in parallel to the X-axis direction (or the Y-axis direction) of the XY stage 18.

Thereby, the both ends of the rotation axes 74 of the rotary mechanism unit 70 can be rotated by being supported by the bearings 77 attached to the outside of the side plates 90 on left and right.

The heat plate 53, the heat block 54, the heat insulation part 57, and the support part 58 provided to the work-holder 52 are integrally joined in the vertical direction and attached to the rotary mechanism unit 70. That is, the work-holder 52 is joined and fixed to the flat plate of the bar-like swing member 73 in the substantially U-like shape of the rotary mechanism unit 70 via the support part 58.

Thereby, through rotating the rotary mechanism unit 70, the support members 60 as well as the work pressers 65 are simultaneously rotated along with the work-holder 52.

As described, through rotating the rotary axes 74 of the rotary mechanism unit 70, the work-holder 52 fixed to the flat plate of the swing member 73 in the vicinity of the substantially U-like shape is rotated. Through designing the structural components of the rotary mechanism unit 70 to be located on the lower side of the rotation axes 74 as described above, the space on the upper side of the rotation axes 74 can be opened wide. This provides a wide movable range for the bonding head. Thereby, bonding can be performed easily for the object to be bonded having three or more bonding faces in different directions.

As shown in FIG. 1 and FIG. 3, the rotary mechanism unit 70 rotates the work-holder 52 having the object to be bonded 44 placed thereon to the front side that is referred hereinafter as a forward direction (F direction) with respect to the position of the object to be bonded 44 or to the back side that is referred hereinafter as reverse direction (R direction), and is capable of continuously rotate from 0 degree to 180 degrees. The rotation of the rotary mechanism unit 70 in the F direction is expressed as 0 degree to 90 degrees, while the rotation thereof in the R direction is expressed as 0 degree to −90 degrees.

Further, the bonding point whose position is determined by rotation is to be within a bondable region by making the rotation centers of the rotation axes 74 of the rotary mechanism unit 70 come within a range from the bottom face of the object to be bonded 44 to the separation distance of the bonding position of the bonding face and by making the object to be bonded 44 come in the vicinity of the rotation axes 74 of the bonding rotary stage 50.

As shown in FIG. 3, the rotary mechanism unit 70 in the bonding rotary stage 50 is rotary-driven by a motor 85 via gears 80, 81, and 82.

The gear 80 with 32 pieces of spur teeth in the present invention is fixed to the rotation axis of the motor 85, and the motor 85 is driven to rotate the rotation axes 74 of the rotary mechanism unit 70 via the gears (spur gears) attached to the three parallel axes. Regarding the gear ratios of each of the gears for transmitting the rotation of the motor 85 to the rotation axes 74, the gear ratio of the gear 80 and the gear 82 of the motor 85 is set to be larger. The gear ratio of the gear 81 on the second axis with 90 pieces of spur teeth in the present invention and the gear 82 on the third axis with 110 pieces of spur teeth in the present invention is set to be 1 or larger (the gear ratio of the gear 80 and the gear 82 according to the present invention is 1:3.4). Thereby, the rotating angle of the rotation axes 74 for the rotational resolution of the motor 85 becomes small, so that the rotary mechanism unit 70 can be rotated at the angle of the high resolution. The middle gear 81 is used for transmission of power, and the gear ratio is set with the ratio of the gear 80 and the gear 82.

Further, the gear 82 on the third axis is fixed to one of the rotation axes 74 of the rotary mechanism unit 70. The motor 85 is driven to rotate the gear 81 on the second axis, the rotating force of the gear 81 on the second axis is transmitted to the gear 82 on the third axis to rotate the gear 82 on the third axis so as to thereby rotate the rotation axes 74 of the rotary mechanism unit 70. The gear 82 on the third axis attached to the rotary mechanism unit 70 does not need to have a tooth surface with the center angle of 360 degrees but may have a tooth surfaces with the center angle of 200 degrees, for example.

The motor 85 has a high torque and is capable of rotating at a high speed. The gear 80 attached to rotation axis of the motor 85 is rotated to give a rotating force to the rotation axes 74 of the rotary mechanism unit 70 via the gears 81 and 82 having different gear ratios to rotary-drive the axes with a large torque.

Further, the motor 85 has a high holding power by generating the large torque with the gears 80, 81, and 82, so that vibration generated in the rotary mechanism unit by stopping the rotation of the motor 85 can be suppressed. Note that the motor 85, the gears 80, 81, 82, and the rotary mechanism unit 70 constitute torque generation means.

It is desirable for the motor 85 to be a step (pulse) motor 85 that is capable of controlling the number of rotation, rotating angles, and the like. Note, however, that the motor 85 is not limited only to the step (pulse) motor 85 but may also be any other types of the motor 85.

As described, the bonding apparatus according to the present invention includes the torque generation means which gives a large torque to the rotation axes 74 of the rotary mechanism unit 70, and performs bonding of the object to be bonded by suppressing the vibration at the time of rotating the work-holder by the torque generation means.

Next, control of the motor 85 of the rotary mechanism unit 70 in the bonding rotary stage 50 will be described.

In order to rotate the rotary mechanism unit 70 by a prescribed angle, the motor 85 is rotated with the number of pulses acquired from the gear ratios of the three axes including the gear 80 of the motor 85 and the resolution (rotating angle per pulse) of the motor 85 when a step motor is used as the motor 85, for example. Further, a signal (origin signal) indicating that the rotary mechanism unit 70 is in a horizontal state that is the reference orientation shows the position of the swing member 73 detected by a sensor attached to the side plates 90 of the bonding rotary stage 50. For example, an "ON" signal is outputted from the sensor when the rotary mechanism unit 70 is in a horizontal state that is the reference orientation. The rotation-axis control part 37 for controlling the motor 85 determines the rotating direction and the number of pulses to rotate the rotary mechanism unit 70 at a prescribed angle on the basis of the origin signal. While the reference orientation is set as a horizontal state in the following explanations, the reference orientation is not limited to a horizontal state but may be a declined orientation that is shifted from the horizontal orientation.

Further, when the rotation axes 74 of the rotary mechanism unit 70 are rotated from 0 degree to 180 degrees (−90 degrees to 0 degree, 0 degree to 90 degrees), a limit signal is outputted from the sensor. Rotation of the motor is stopped by the limit signal so that the rotary mechanism unit 70 does not rotate over 180 degrees from 0 degree (−90 degrees to 0 degree, 0 degree to 90 degrees).

Thereby, the rotary mechanism unit 70 of the bonding rotary stage 50 becomes rotatable from 0 degree to 180 degrees (±90 degrees) on a right-side view with respect to the rotation axes 74 while placing the work-holder 52 that is configured with the heat plate 53 having the object to be bonded 44 placed thereon, the heat block 54, and the work pressers 65.

While the rotary mechanism unit 70 is capable of rotating the work-holder 52 having the object to be bonded 44 placed thereon over 180 degrees from 0 degree about the rotation axis 74 in terms of its configuration, it is controlled to be rotatable from 0 degree to 180 degrees (±90 degrees) in order to prevent interference or the like with the bonding arm 4 and the bonding tool 6.

In a general-purpose bonding apparatus, the orientation of its bonding stage is not changed. Thus, it is possible to perform adjustment on the basis of the bonding stage even when the distances of the bonding positions of an object to be bonded in height direction with respect to the bonding stage vary. In the present invention, however, there are bonding sections of different separation distances of bonding positions existing in three or more bonding faces. Therefore, it is difficult to adjust the separation distances of the bonding positions on the basis of the bonding stage unlike the case of the general-purpose bonding apparatus.

Thus, the bonding apparatus 1 according to the present invention performs bonding through rotating, by using the rotary mechanism unit 70, the object to be bonded having bonding points on a flat face that is the reference orientation and on an opposing face that is perpendicular to the flat face without changing the moving distance of the bonding tool 6.

In order to perform bonding of the object to be bonded having three or more bonding faces in different directions, the present invention is configured to perform bonding by rotating the rotary mechanism unit 70 of the bonding stage (bonding rotary stage) to correct the difference in the separation distances of the bonding positions of the object to be bonded.

Further, the bonding rotary stage 50 shown in FIG. 3 includes a slide mechanism (not shown) which drives the claw-like work pressers 65 for holding the object to be bonded 44 being placed on the heat plate 53 from left and right. The slide mechanism slides the support members 60 that support the work pressers 65 for moving the work pressers 65. The slide mechanism operates independently from the rotary mechanism unit 70, and it is fixed to a casing of the bonding rotary stage 50. The slide mechanism is configured with a cylinder and the like, and moves the work pressers 65 laterally according to signals from the drive unit 39.

The object to be bonded 44 by the bonding apparatus according to the present invention is a semiconductor laser package or the like having three or more bonding faces in different directions. The semiconductor laser package emitting laser beams is configured by mounting a semiconductor laser chip on a pedestal of a package, connecting electrodes and the like of the semiconductor chip and a lead terminal via a wire by performing wire bonding, and placing a cap thereover. The semiconductor laser package emits oscillation light from the side face of the semiconductor laser chip. Therefore, in order to direct the oscillation light toward the perpendicular direction, the semiconductor laser chip is mounted on the side face of the support part. One of the electrodes of the semiconductor laser chip is provided on the surface of the semiconductor laser chip. Therefore, bonding is performed by rotating each of the three or more faces in different directions of the semiconductor laser chip to correct the difference in the separation distances of the bonding positions of the object to be bonded.

Further, the object to be bonded 44 is not limited to the semiconductor laser package having three or more bonding faces in different directions. For example, the separation distances of the bonding positions within a same face may be equivalent, different, or mixture of those.

As described above, the wire bonding apparatus as the bonding apparatus 1 includes: the XY stage 18 capable of moving in the X-axis and Y-axis directions; the bonding head 3 having the bonding tool 6 capable of moving in the Z-axis direction by being placed on the XY stage 18; and the bonding rotary stage 50 which includes the rotary mechanism unit 70 having the rotation axes 74 in parallel to the X-axis (or the Y-axis) of the XY stage 18 for rotating the object to be bonded 44. This makes it possible to perform bonding of the object to be bonded having three or more bonding faces in different directions and on the object to be bonded having electrodes of different separation distances of bonding positions within a same face.

Further, as shown in FIG. 4, the wire bonding apparatus as the bonding apparatus 1 includes: a bonding-position information input part 30 which inputs bonding positions of the object to be bonded. The bonding-position information input part 30 inputs position coordinates of the XY-axes and Z-axis by teaching or the like executed by an operator. The wire bonding apparatus further includes a rotary-stage-angle rotating information input part 31 which inputs the rotating angle of the rotation axis of the rotary mechanism unit 70. The rotary-stage-angle rotating information input part 31 inputs the rotating angle including the rotating direction of the object to be bonded at the time of bonding, i.e., inputs the rotating angle for correcting the difference in the separation distances of a plurality of bonding positions of the bonding points within the face. Thereby, the positions to be bonded (bonding points) within the face are designated by the position coordinates of the XY stage 18 on the X-axis and Y-axis, the position coordinate of the bonding tool 6 on the Z-axis, and the rotating angle of the rotation axes 74 of the rotary mechanism unit 70. The positional data for each bonding point is stored in the memory 22 of the control unit 20.

Further, as shown in FIG. 4, the control unit 20 reads out the positional data stored in the memory 22 at the time of bonding and outputs the data of the rotating angle to the rotation-axis control part 37. The rotation-axis control part 37 controls the drive unit 39 such that the motor 85 executes a prescribed rotating action. The rotation of the motor 85 is transferred to the rotation axes 74 via the gears 80, 81, and 82, thereby rotating the rotation axes 74. The gear ratio between the gear 80 attached to the rotation axis of the motor 85 and the gear 82 for driving the rotation axes 74 takes a large value. Thus, by applying a large torque to the rotation axes 74, the rotary mechanism unit can be stabilized and vibration can be suppressed to perform stable bonding. Therefore, it is possible to bring the mount position of the object to be bonded to a position in the vicinity of the rotation axes and to suppress vibration of the rotary mechanism unit.

Next, described by referring to FIG. 5, FIG. 6, and FIGS. 7A, 7B and 7C is the positional relation between the object to be bonded and the bonding tool associated with the rotation of the rotary mechanism unit of the bonding rotary stage in the bonding actions performed by the bonding apparatus of the present invention.

Figure 5:
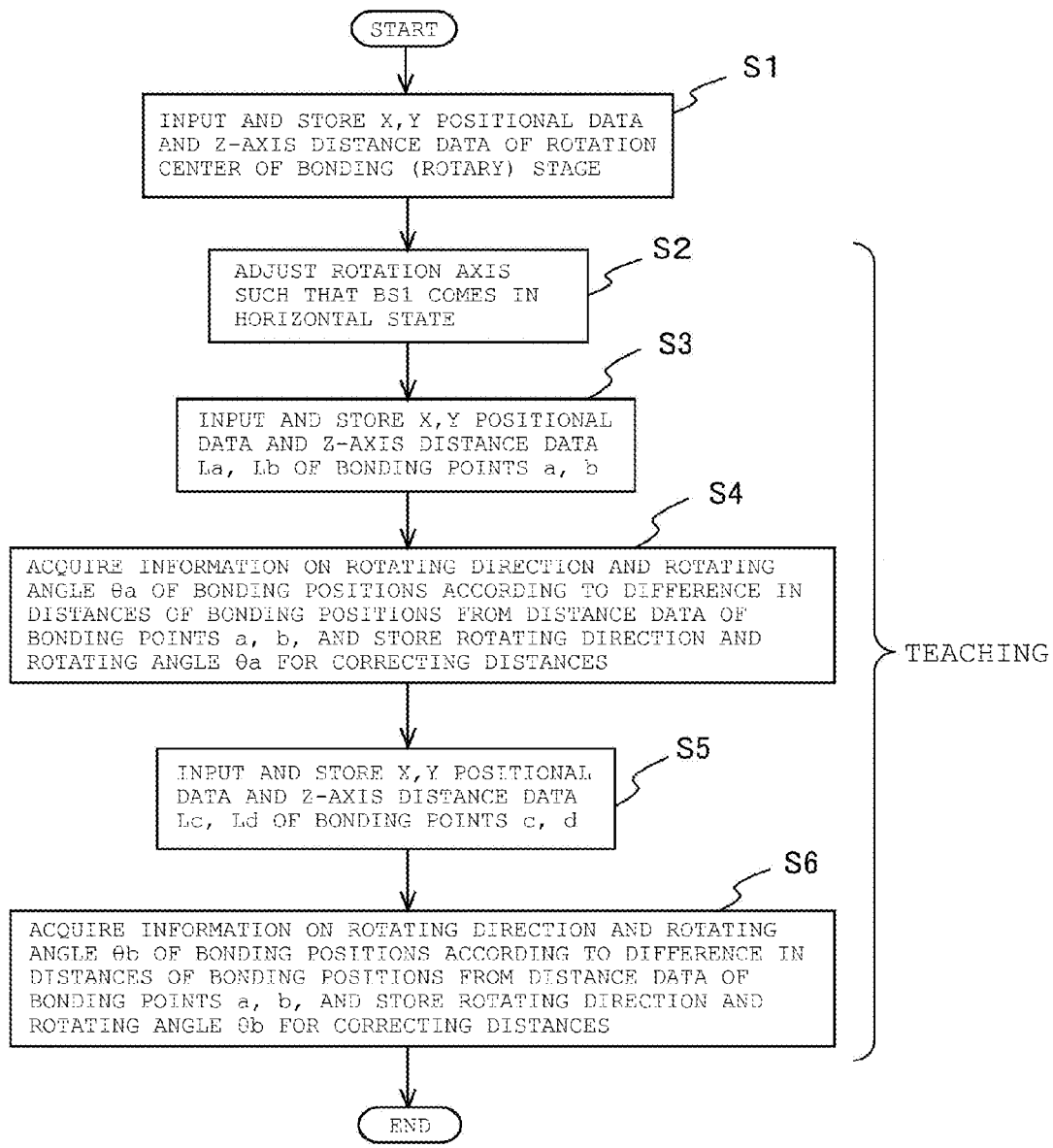
FIG. 5 is a flowchart showing teaching actions of the bonding apparatus which performs bonding of an object to be bonded having electrodes of different separation distances of bonding positions within a first face.

FIG. 5 is a flowchart showing teaching actions of the bonding apparatus which performs bonding of an object to be bonded having electrodes of different separation distances of bonding positions within a first face.

Figure 6:
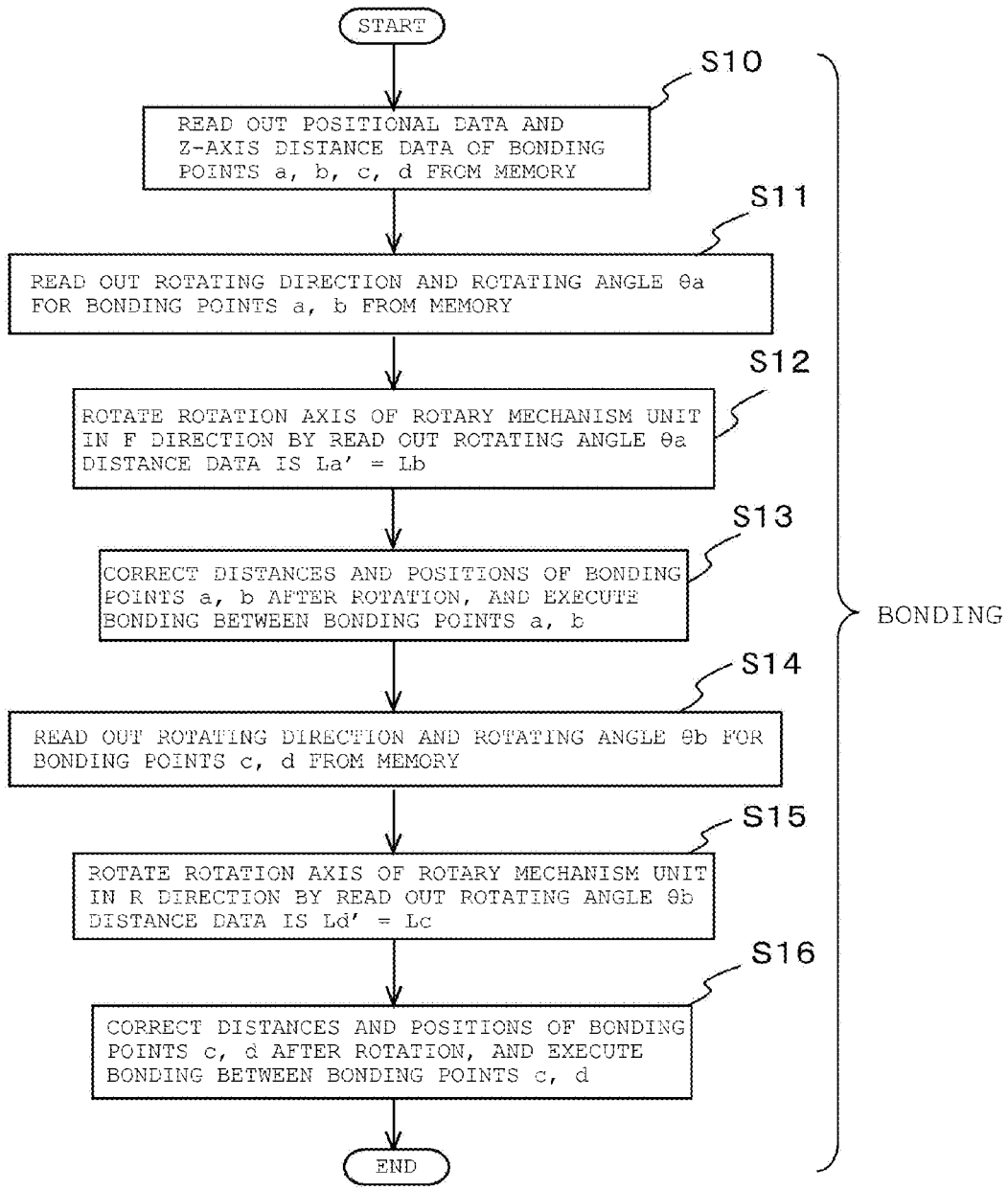
FIG. 6 is a flowchart showing bonding actions of the bonding apparatus which performs bonding of an object to be bonded having electrodes of different separation distances of bonding positions within the first face.

FIG. 6 is a flowchart showing bonding actions of the bonding apparatus which performs bonding of an object to be bonded having electrodes of different separation distances of bonding positions within the first face.

Figure 7A:
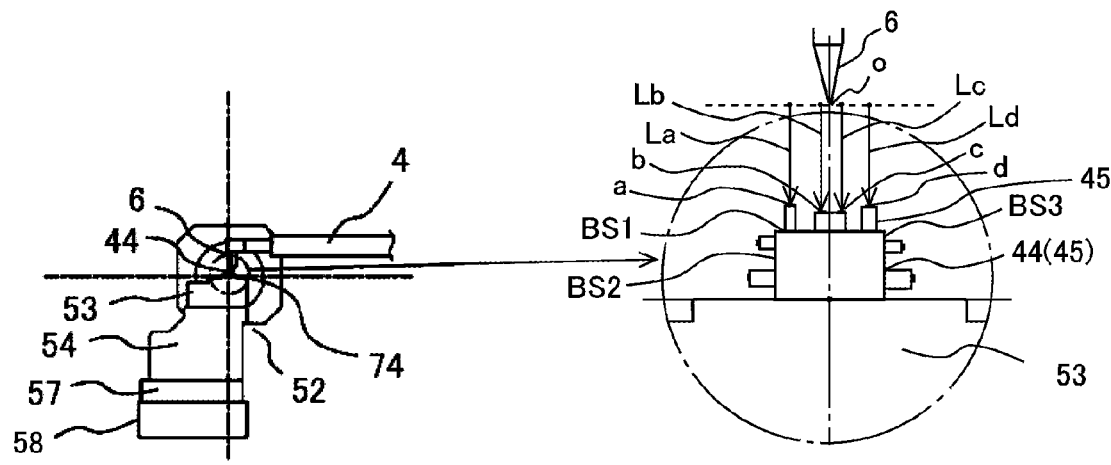
FIGS. 7A, 7B and 7C show views of positional relations between bonding points of the object to be bonded and a bonding tool in the teaching and bonding actions shown in FIG. 5 and FIG. 6.
Figure 7B:
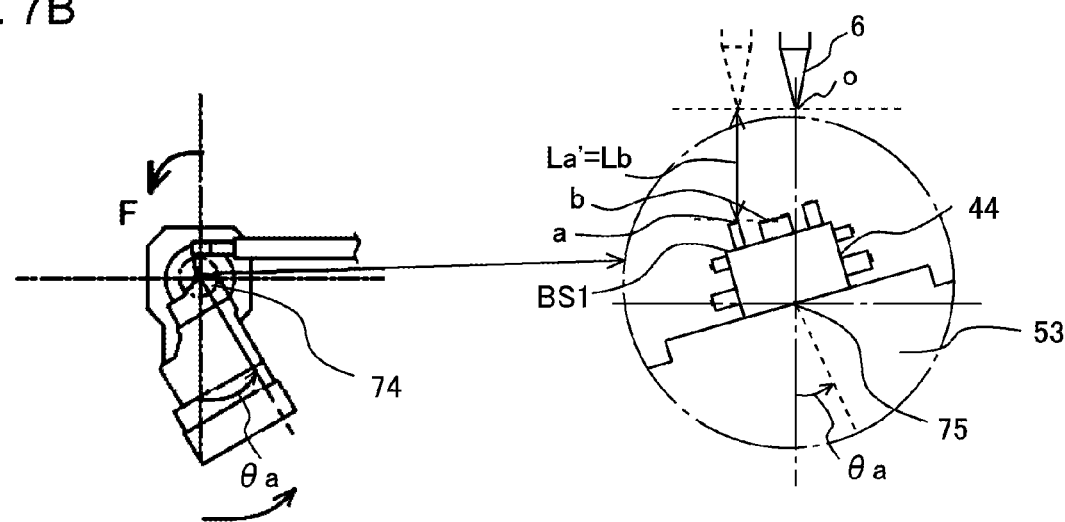
Figure 7C:
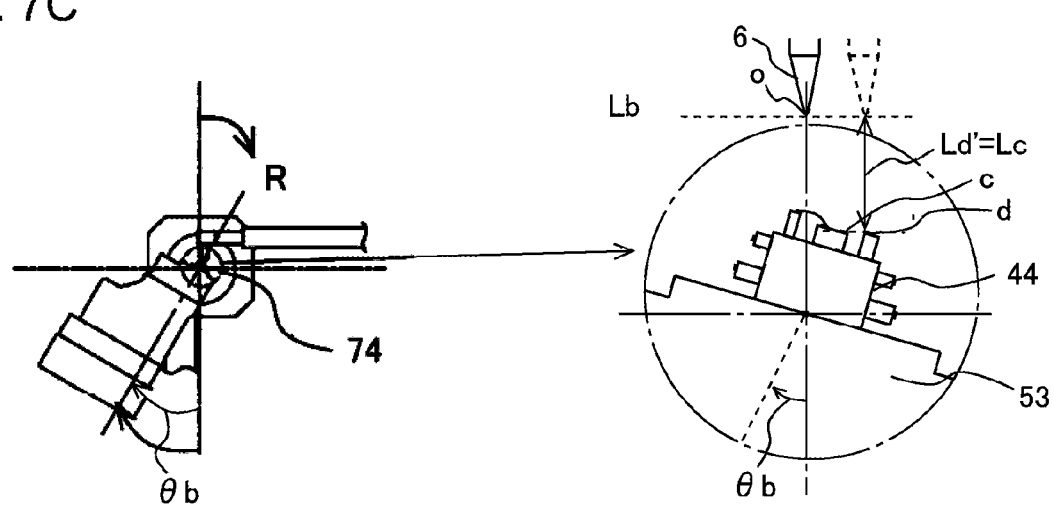

FIGS. 7A, 7B and 7C show views of positional relations between bonding points of the object to be bonded and the bonding tool in the teaching and bonding actions shown in FIG. 5 and FIG. 6. Note that circles shown with alternate long and short dash lines are enlarged views showing the positional relations between the object to be bonded 44 and the bonding tool 6 in the vicinity of the work-holder 52.

As shown in FIG. 5, at first, X, Y positional data of the rotation center of the bonding rotary stage 50 and the distance data on the Z-axis are inputted to store the data to the memory (step S1 shown in FIG. 5). The data of the rotation center of the bonding rotary stage 50 is used for calculating a new bonding position associated with the rotation for correcting the difference in the separation distances of the bonding positions. Input of the data of the rotation center of the bonding rotary stage 50 is to be performed at the time of starting up the bonding apparatus, for example.

As shown in FIG. 7A, the semiconductor laser package 44 as the object to be bonded having a semiconductor laser chip 45 mounted thereon is placed on the heat plate 53 of the work-holder 52. The work-holder 52 includes the heat plate 53, the heat block 54, the heat insulation part 57, and the support part 58.

FIG. 7A shows a state where the semiconductor laser package 44 having the semiconductor laser chip 45 mounted thereon and having a lead on its lower part (not shown) is placed on the heat plate 53. As shown in FIG. 7A, there are three bonding faces in different directions, and each of the faces is referred to as a first face BS1, a second face BS2, and a third face BS3. In a state where the XY stage 18 is set in the reference orientation, bonding points a, b, c, and d are located on the first face BS1.

Next, as shown in FIG. 7A, the X, Y positional data of the bonding points a, b and distance data La, Lb on the Z-axis are inputted. The distance data La is the distance from the origin o that is the origin position (taken as the reference position) of the capillary 6 to the bonding point a. The distance data Lb is the distance from the origin o to the bonding point b. After inputting the distance data, the X, Y positional data of the bonding point a and the distance data La, Lb on the Z-axis are stored in the memory (step S3 shown in FIG. 5).

Next, information regarding the rotating direction and a rotating angle θa is acquired for correcting the difference in the separation distances of the bonding positions according to the difference in the separation distances of the bonding positions from the distance data La, Lb of the bonding points a, b. The acquired rotating direction and the rotating angle θa are stored in the memory (step S4 shown in FIG. 5).

Next, the X, Y positional data of the bonding points c, d and the distance data Lc, Ld on the Z-axis are inputted. The distance data Lc is the distance from the origin o to the bonding point c, and the distance data Ld is the distance from the origin o to the bonding point d. After inputting the distance data, the X, Y positional data of the bonding points c, d and the distance data Lc, Ld on the Z-axis are stored in the memory (step S5 shown in FIG. 5).

Next, information regarding the rotating direction and a rotating angle θb is acquired for correcting the difference in the separation distances of the bonding positions according to the difference in the separation distances of the bonding positions from the distance data Lc, Ld of the bonding points c, d. The acquired rotating direction and the rotating angle θb are stored in the memory (step S6 shown in FIG. 5). While described is the embodiment which acquires the information regarding the rotating direction and the rotating angle for correcting the difference in the separation distances of the bonding positions from the distance data of the bonding points at the time of teaching actions, the information regarding the rotating direction and the rotating angle may be acquired from the distance data of the bonding points at the time of bonding. As described, when executing the teaching actions, the information regarding the rotating direction and the rotating angle is acquired to correct the distance.

Next, bonding of the first face BS1 shown in FIG. 7A will be described. For the bonding, the information and the like regarding the rotating direction and the rotating angle stored in the memory in the teaching are read out, and bonding processing is performed based on the information. At first, the positional data of the bonding points a, b, c, d and the distance data on the Z-axis are read out from the memory (step S10 shown in FIG. 6). Further, the data of the rotating direction and the rotating angle θa at the bonding points a, b is read out from the memory (step S1 shown in FIG. 6).

Next, the rotation axes 74 of the rotary mechanism unit 70 are rotated in the F direction by the read out rotating angle θa. At this time, the distance data of the bonding point a is expressed as La'=Lb (step S12 shown in FIG. 6).

As shown in FIG. 7B, correction of the distances and the positions of the bonding points a, b after the rotation is executed, and bonding between the bonding points a, b is performed (step S13 shown in FIG. 6). The correction of the distance is executed to make a fine adjustment of the distance associated with the rotation of the bonding points, and it is also executed in the bonding processing shown below in the same manner.

Next, the data regarding the rotating direction and the rotating angle θb at the bonding points c, d is read out from the memory (step S14 shown in FIG. 6).

Then, the rotation axes 74 of the rotary mechanism unit 70 are rotated in the R direction at the read out rotating angle θb. At this time, the distance data of the bonding point d is expressed as Ld'=Lc (step S15 shown in FIG. 6).

Correction of the distances and the positions of the bonding points c, d after the rotation is executed, and bonding between the bonding points c, d is performed (step S16 shown in FIG. 6). In the manner described above, bonding of the bonding points a, b, c, d on the first face BS1 in the semiconductor laser package 44 is performed. As described, the distance is changed in association with the rotation of the rotation axes, so that the correction of the distance as the fine adjustment is executed.

In the teaching actions and the bonding actions described below, the information regarding the rotating directions and the rotating angles to correct the distances when performing the teaching. Further, for bonding, the information and the like regarding the rotating directions and the rotating angles stored in the memory in the teaching is read out, and bonding processing is performed based on the information.

Figure 8:
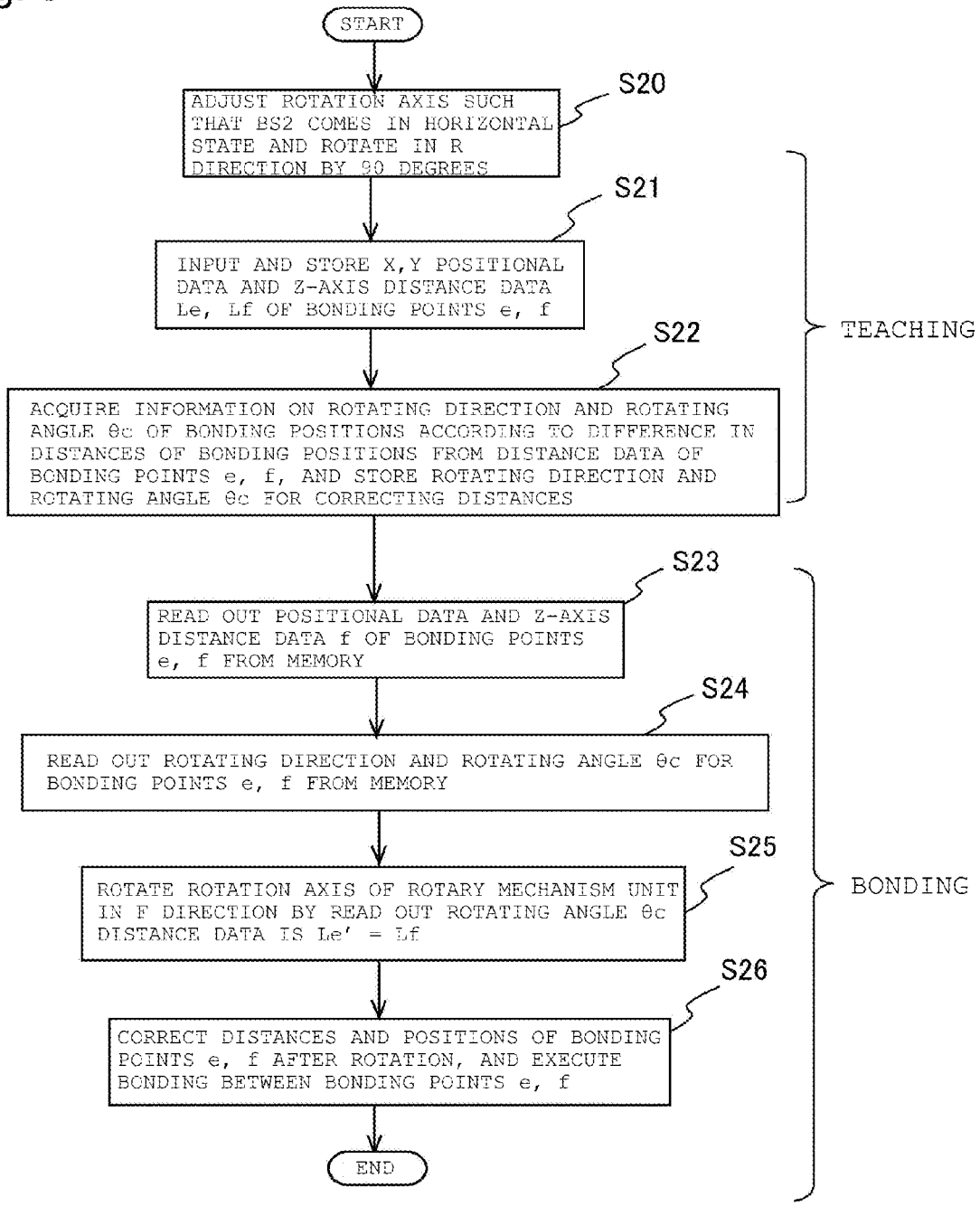
FIG. 8 is a flowchart showing teaching and bonding actions of an object to be bonded having electrodes of different separation distances of bonding positions within a second face.
Figure 9A:
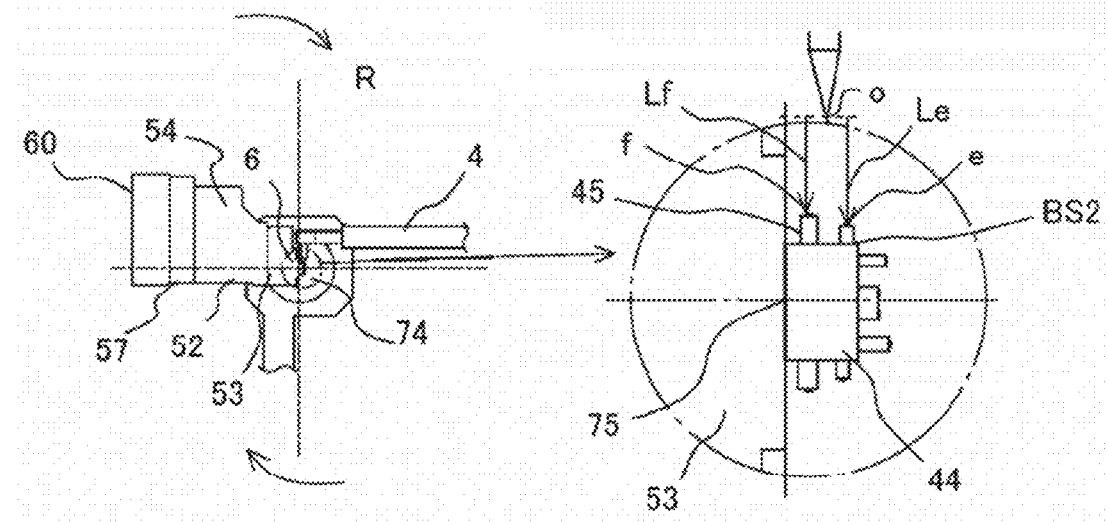
FIGS. 9A and 9B show views of positional relations between bonding points of the object to be bonded and the bonding tool in the teaching and bonding actions shown in FIG. 8.
Figure 9B:
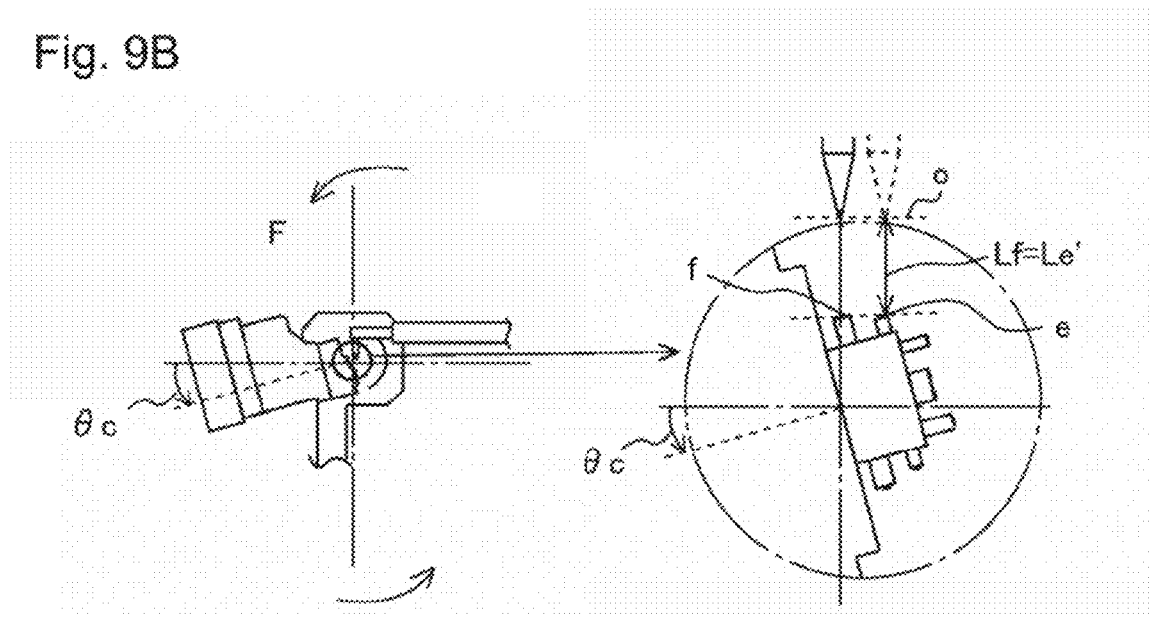

Next, bonding actions of a case where the bonding points are located on the second face of the semiconductor laser chip 45 will be described by referring to FIG. 8 and FIGS. 9A and 9B. FIG. 8 is a flowchart showing teaching and bonding actions of an object to be bonded having electrodes of different separation distances of bonding positions within the second face. FIGS. 9A and 9B show views of positional relations between the bonding points of the object to be bonded and the bonding tool in the teaching and bonding actions shown in FIG. 8

For example, when the bonding points are on the second face BS2 as shown in FIG. 9A, the teaching actions are performed by moving the semiconductor laser package 44 as shown with an arrow through rotating the rotation axes 74 of the rotary mechanism unit 70 by 90 degrees ($\theta$=–90 degrees) in the R direction since the bonding points e, f are on the side face of the semiconductor laser chip 45 (step S20 shown in FIG. 8).

At this time, the rotation axes 74 are rotated about the axis center 75 that is the position where the bottom face of the semiconductor laser package 44 comes in contact with the surface of the heat plate 53. As shown in FIG. 9A, when the work-holder 52 is rotated by 90 degrees, the second face BS2 having the bonding points e, f of the semiconductor laser package 44 is located horizontally. Thereafter, the X, Y positional data and the distance data Le, Lf on the Z-axis regarding the bonding points e, f are inputted to be stored in the memory (step S21 shown in FIG. 8). The distance data Le is the distance from the origin o to the bonding point e, and the distance data Lf is the distance from the origin o to the bonding point f.

Then, information regarding the rotating direction and a rotating angle $\theta$c is acquired for correcting the difference in the separation distances of the bonding positions according to the difference in the separation distances of the bonding positions from the distance data Le, Lf of the bonding points e, f. The acquired rotating direction and the rotating angle $\theta$c are stored in the memory (step S22 shown in FIG. 8). The teaching actions are performed only once for the same semiconductor laser packages 44.

Next, bonding of the second face BS2 shown in FIG. 9A will be described. At first, the positional data of the bonding points e, f and the distance data Le, Lf on the Z-axis are read out from the memory (step S23 shown in FIG. 8). Further, the data of the rotating direction and the rotating angle $\theta$c at the bonding points e, f is read out from the memory (step S24 shown in FIG. 8).

Next, as shown in FIG. 9B, the rotation axes 74 of the rotary mechanism unit are rotated in the F direction by the read out rotating angle $\theta$c. At this time, the distance data of the bonding point e is expressed as Le'=Lf (step S25 shown in FIG. 8). Correction of the distances and the positions of the bonding points e, f after the rotation is executed, and bonding between the bonding points e, f is performed (step S26 shown in FIG. 8).

In the manner described above, bonding of the bonding points e, f on the second face BS2 in the semiconductor laser package 44 is performed.

Figure 10:
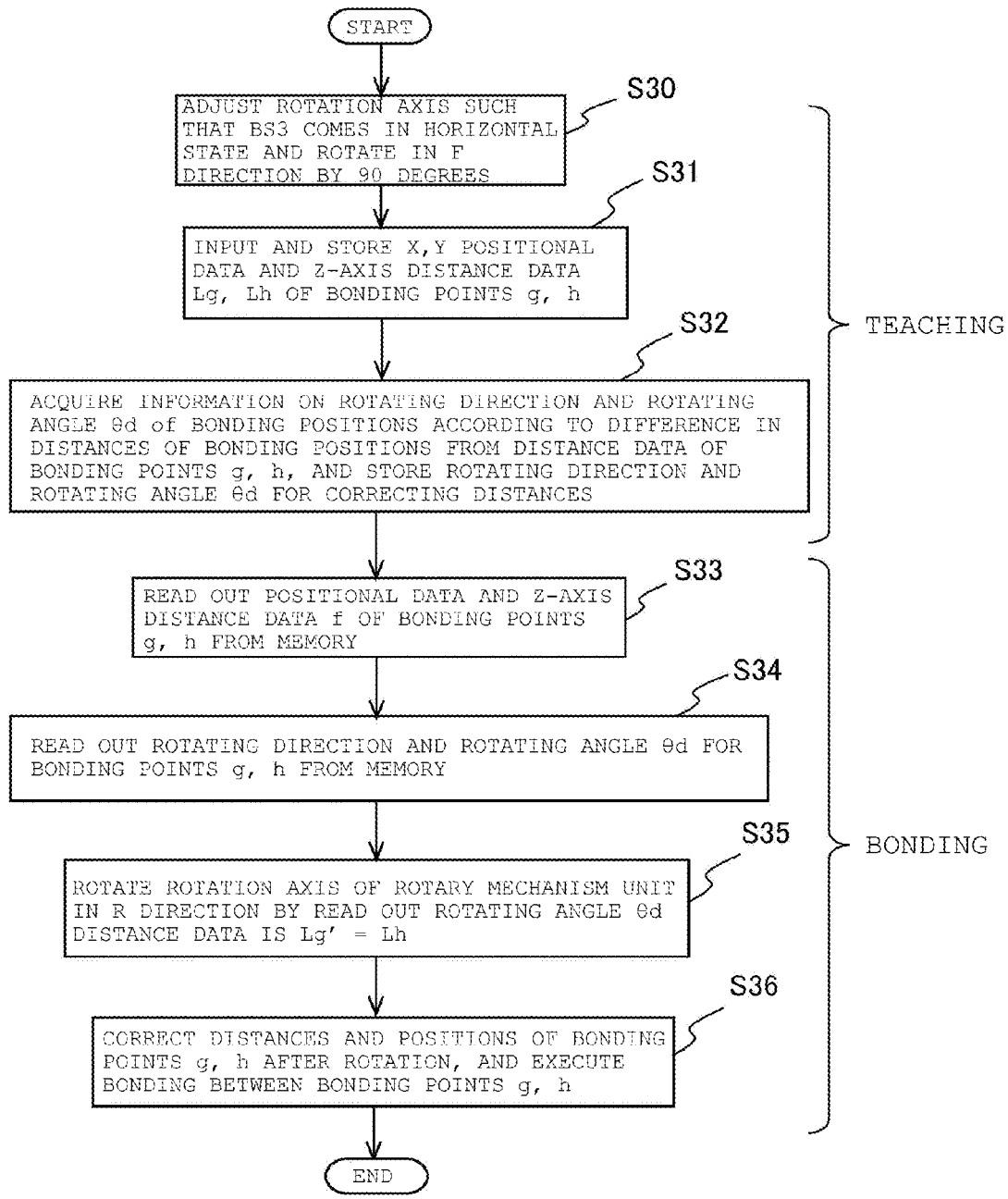
FIG. 10 is a flowchart showing teaching and bonding actions of an object to be bonded having electrodes of different separation distances of bonding positions within a third face.
Figure 11A:
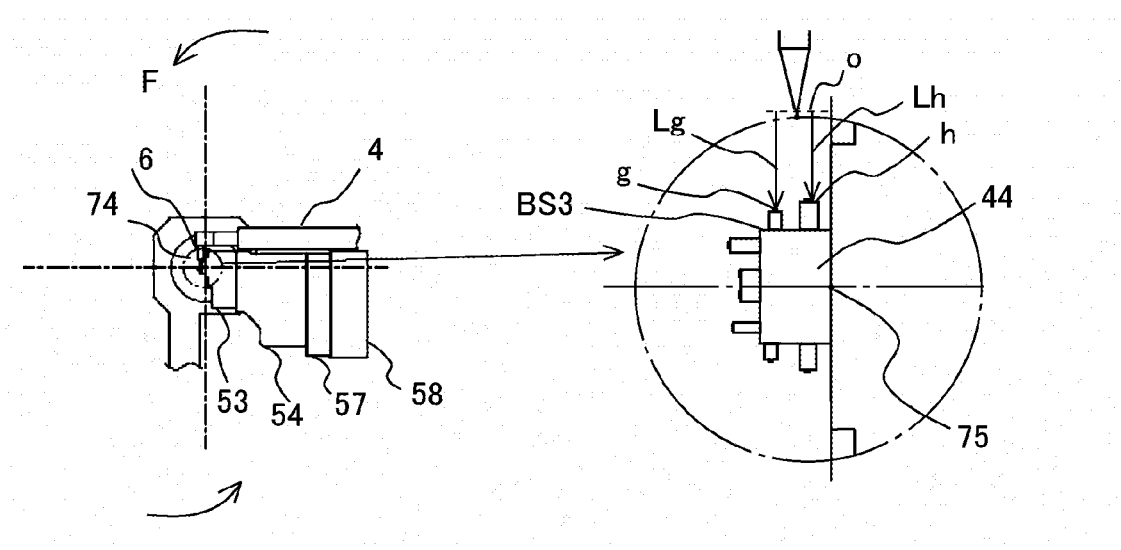
FIGS. 11A and 11B show views of positional relations between bonding points of the object to be bonded and the bonding tool in the teaching and bonding actions shown in FIG. 10.
Figure 11B:
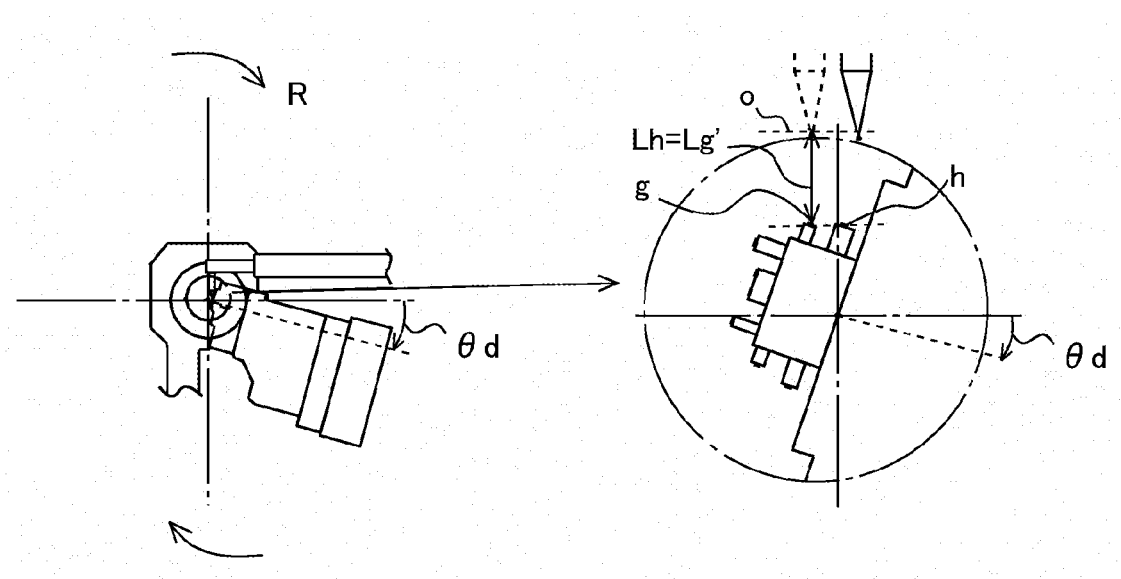

Next, bonding actions of a case where the bonding points are located on the third face of the semiconductor laser chip 45 will be described by referring to FIG. 10 and FIGS. 11A and 11B. FIG. 10 is a flowchart showing teaching and bonding actions of an object to be bonded having electrodes of different separation distances of bonding positions within the third face. FIGS. 11A and 11B show views of positional relations between the bonding points of the object to be bonded and the bonding tool in the teaching and bonding actions shown in FIG. 10

As shown in FIG. 11A, when the bonding points g, h on the third face BS3 are located on the side face of the semiconductor laser chip 45, the teaching actions are performed by rotating the semiconductor laser package 44 by 90 degrees (90 degrees) in the F direction by the rotary mechanism unit 70 (step S30 shown in FIG. 10).

As shown in FIG. 11A, when the work-holder 52 is rotated by $\theta$=90 degrees, the third face BS3 having the bonding points g, h is located horizontally. Thereafter, the X, Y positional data and the distance data Lg, Lh on the Z-axis regarding the bonding points g, h are inputted to be stored in the memory (step S31 shown in FIG. 10). The distance data Lg is the distance from the origin o to the bonding point g, and the distance data Lh is the distance from the origin o to the bonding point h.

Then, information regarding the rotating direction and a rotating angle $\theta$d is acquired for correcting the difference in the separation distances of the bonding positions according to the difference in the separation distances of the bonding positions from the distance data Lg, Lh of the bonding points g, h. The acquired rotating direction and the rotating angle $\theta$d are stored in the memory (step S32 shown in FIG. 10). The teaching actions are performed only once for the same semiconductor laser packages 44.

Next, bonding of the third face BS32 shown in FIG. 11A will be described. At first, the positional data of the bonding points g, h and the distance data Lg, Lh on the Z-axis are read out from the memory (step S33 shown in FIG. 10). Further, the data of the rotating direction and the rotating angle $\theta$d at the bonding points g, h is read out from the memory (step S34 shown in FIG. 10).

Next, as shown in FIG. 11B, the rotation axis 74 of the rotary mechanism unit is rotated in the F direction by the read out rotating angle $\theta$d. At this time, the distance data of the bonding point e is expressed as Lg'=Lh (step S35 shown in FIG. 10). Correction of the distances and the positions of the bonding points g, h after the rotation is executed, and bonding between the bonding points g, h is performed (step S36 shown in FIG. 10).

In the manner described above, bonding of the bonding points g, h on the third face BS3 in the semiconductor laser package 44 is performed.

In the bonding apparatus according to the present invention, the height of the surface of the work-holder 52 when rotated in the F direction from 0 degree to 90 degrees ($\theta$=90 degrees) is set to be lower than the height of the face of the bonding arm 4 when the bonding tool 6 is at the lowest lift-down point in the bondable region, so that the work-holder 52 does not interfere with the bonding arm 4 within the bondable region of the bonding tool 6. As described above, the structural components of the rotary mechanism unit 70 of the bonding apparatus according to the present invention are designed to be located on the lower side of the rotation axes 74. This provides a wide movable range for the bonding head 3.

Conventional bonding apparatuses are designed to rotate only in the back side (R direction) thereof. However, the bonding apparatus of the present invention can rotate the work-holder also in the front side (F direction) up to 90 degrees, so that it is possible to perform bonding on the three faces while having the object to be bonded 44 placed on the heat plate 53.

Hereinafter, described by referring to FIGS. 12A to 12D is a bonding apparatus which performs bonding by correcting difference in the separation distances of the bonding positions of the object to be bonded having bonding points of the different separation distances of the bonding positions within a face. FIGS. 12A to 12D show views for describing correction of the separation distances of the bonding positions of the object to be bonded having different separation distances of the bonding positions.

Figure 12A:
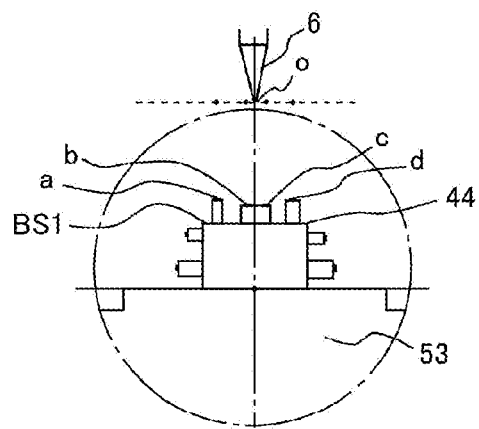
FIGS. 12A, 12B, 12C and 12D show views for describing correction of a difference in the separation distances of the bonding positions of the object to be bonded having different bonding position distances.
Figure 12B:
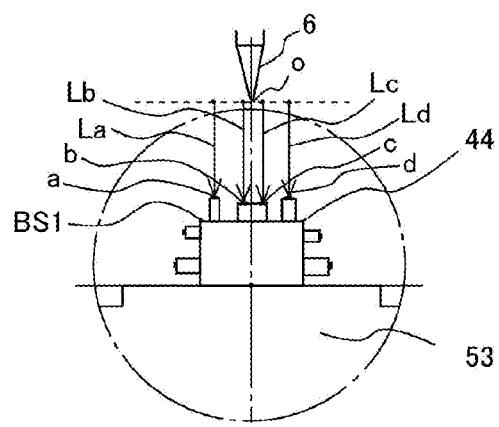

As shown in FIG. 12A, the object to be bonded has terminals a, b, c, and d of different separation distances of bonding positions on a single face BS1, for example. At first, the bonding positions of the terminals a, b, c, d are inputted by teaching, i.e., positional data on the X-axis and Y-axis and the distance data on the Z-axis are inputted by the bonding-position information input part 30, to store the data in the memory. As shown in FIG. 12B, the distance data of the terminals a, b, c, d are defined as La, Lb, Lc, Ld. The distance data La is the distance from the origin o to the terminal a, the distance Lb is the distance from the origin o to the terminal b, the distance data Lc is the distance from the origin o to the terminal c, and the distance Ld is the distance from the origin o to the terminal d. Note that the terminals b, c are located on a same chip and defined to be Lb=Lc.

Next, information regarding the rotating direction and the rotating angle θa is acquired for correcting the difference in the separation distances of the bonding position according to the difference in the separation distances of the bonding positions from the distance data La, Lb of the bonding points a, b. Further, information regarding the rotating direction and the rotating angle θb is acquired for correcting the difference in the separation distances of the bonding positions according to the difference in the separation distances of the bonding positions from the distance data Lc, Ld of the bonding points c, d. The acquired rotating directions and the rotating angles θa, θb are stored in the memory.

Figure 12C:
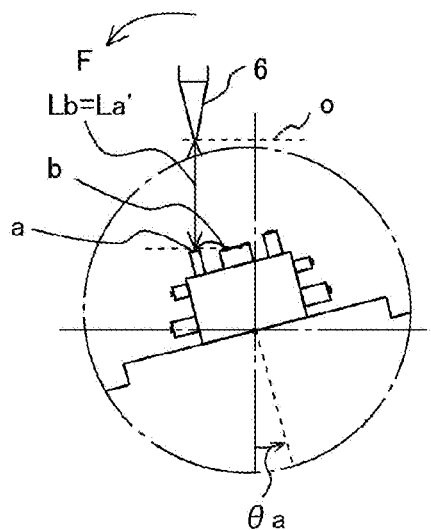

Next, as shown in FIG. 12C, the rotation axes of the rotary mechanism unit are rotated by the rotating angle θa read out from the memory. At this time, the distance data of the bonding point a is expressed as La'=Lb. Correction of the distances and the positions of the bonding points a, b after the rotation is executed, and bonding between the bonding points a, b is performed.

Next, as shown in FIG. 12C, the rotation axes of the rotary mechanism unit are rotated by the rotating angle θb read out from the memory. At this time, the distance data of the bonding point d is expressed as Ld'=Lc. Correction of the distances and the positions of the bonding points c, d after the rotation is executed, and bonding between the bonding points c, d is performed.

Figure 12D:
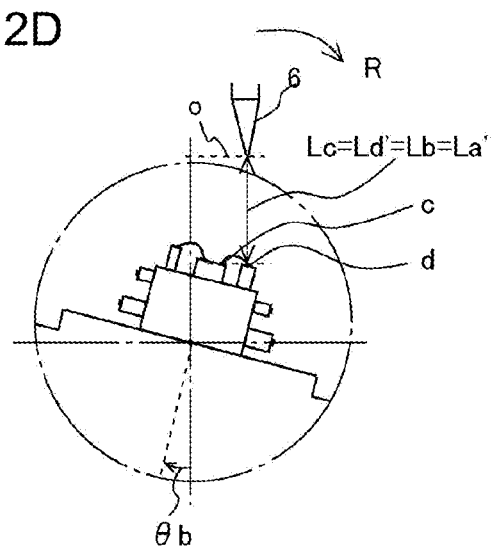

At this time, Lc=Ld'=Lb=La' is satisfied as shown in FIG. 12D by executing correction according to the difference in the separation distances of the bonding positions of the object to be bonded at different distances on the Z-axis. As described, correction is executed such that the separation distances of the bonding positions of the bonding points a, b, c, d on the first face BS1 shown in FIG. 12D become equivalent.

In the manner described above, bonding of the bonding points a, b, c, d on the first face BS1 in the semiconductor laser package 44 is performed.

As described, the bonding apparatus according to the present invention corrects the difference in the separation distances of the bonding positions of a plurality of bonding points by controlling rotation of the work-holder in accordance with the difference in the separation distances of the bonding positions for the object to be bonded having different distances of the bonding positions of the plurality of bonding points within a face. Therefore, it is possible to perform bonding processing on the plurality of bonding sections of different distances for the reference (origin) position of the object to be bonded and also to narrow the movable range of the bonding tool so that the bonding precision can be improved.

Next, described by referring to FIG. 13 to FIG. 16H is a case of performing wire bonding for bonding an object to be bonded having three or more bonding faces in different directions by using the bonding apparatus according to the present invention.

Figure 13:
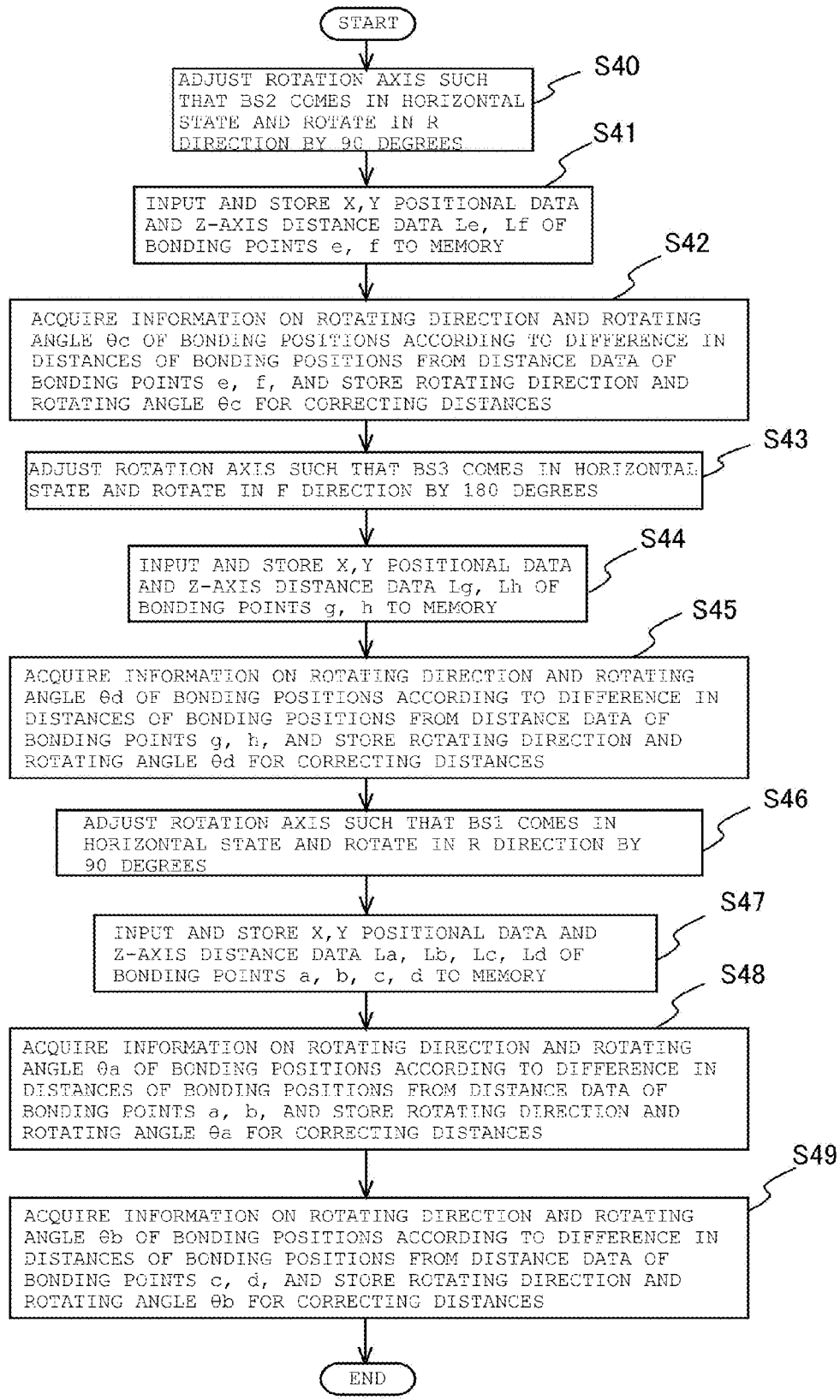
FIG. 13 is a flowchart showing teaching actions of a wire bonding apparatus which performs wire bonding of an object to be bonded having bonding faces on a flat face in a horizontal state as a reference orientation and on an opposing face perpendicular to the flat face.
Figure 14:
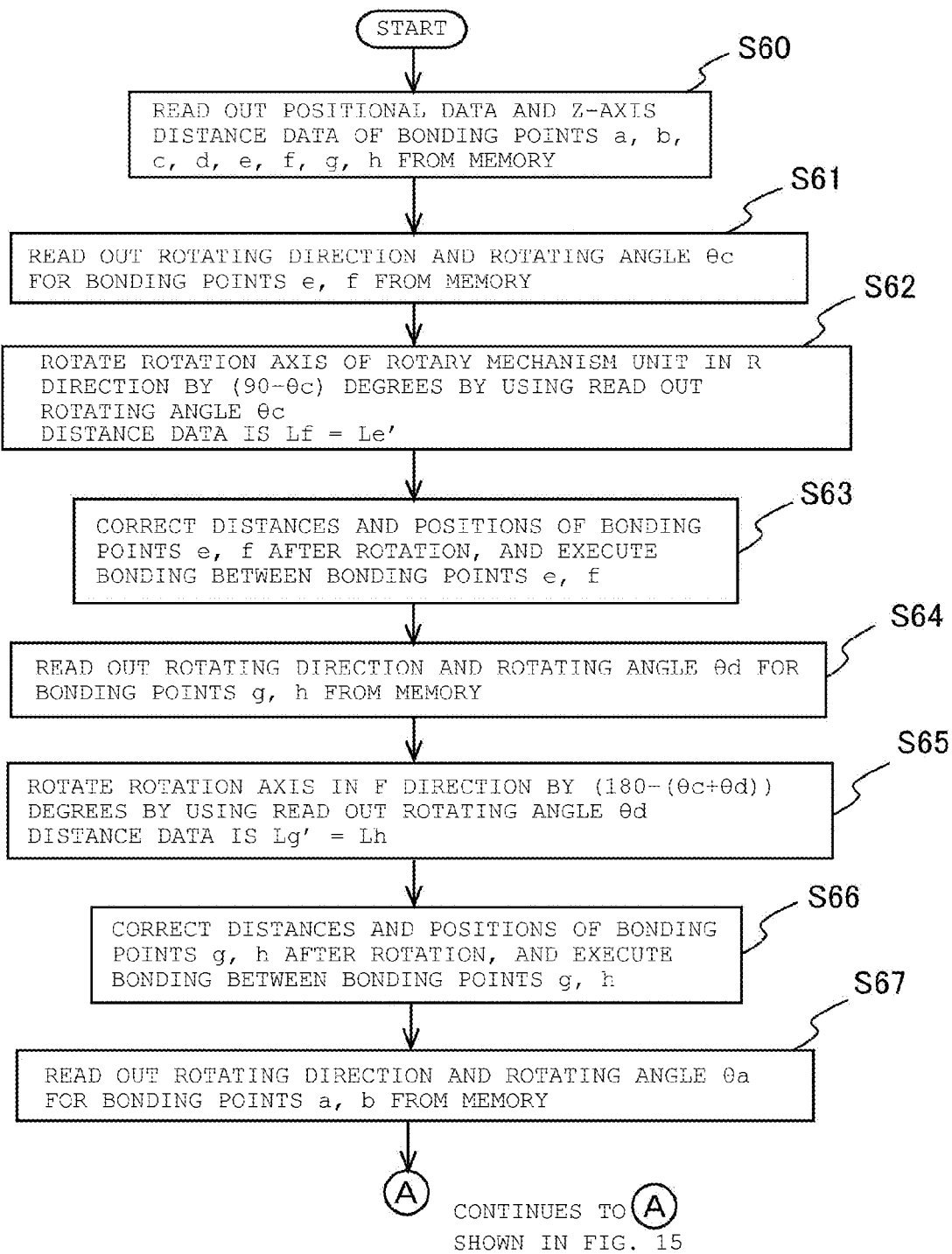
FIG. 14 is a flowchart showing bonding actions of the wire bonding apparatus which performs wire bonding of the object to be bonded having the bonding faces on the flat face in a horizontal state as the reference orientation and on the opposing face perpendicular to the flat face.
Figure 15:
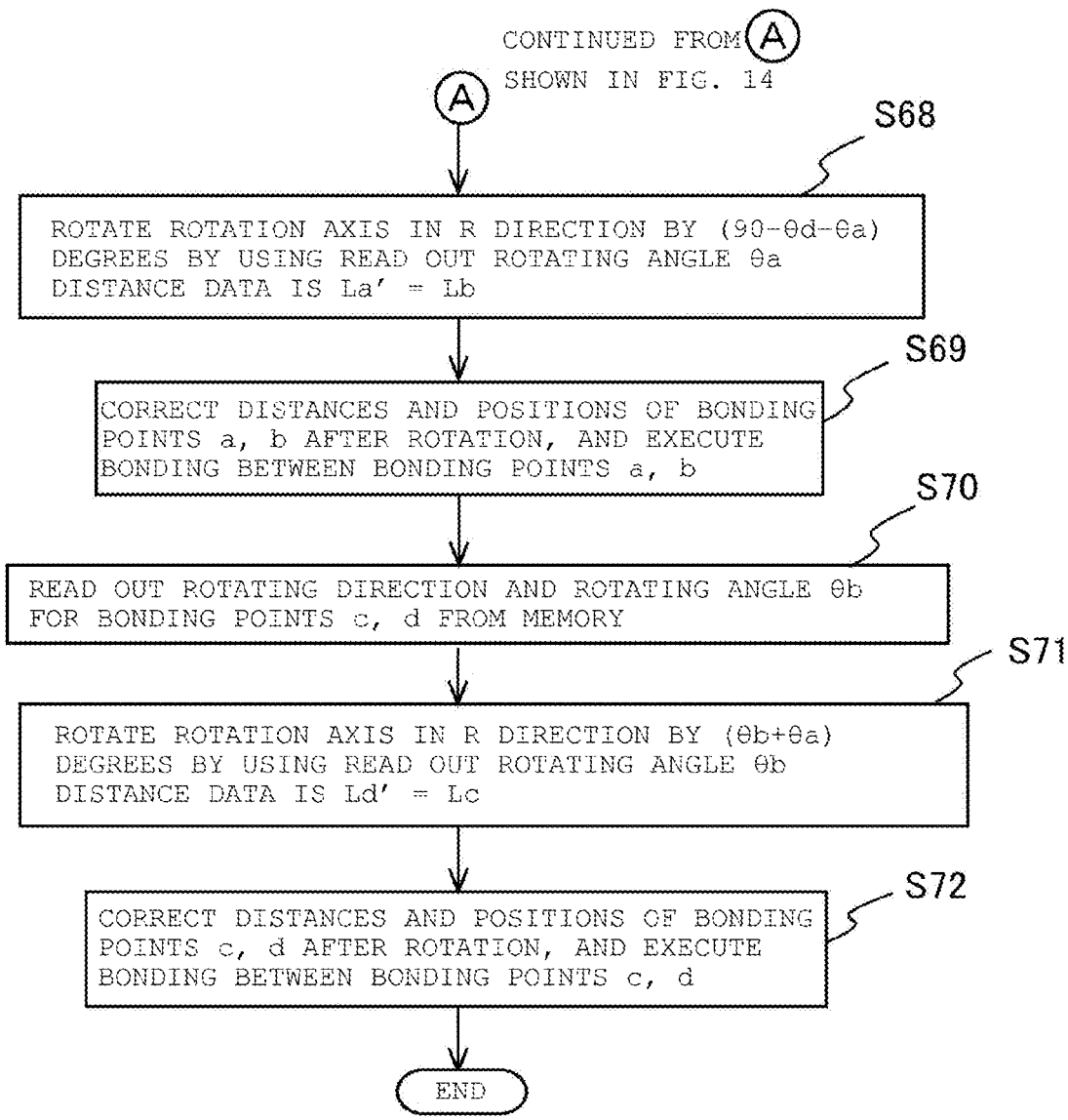
FIG. 15 shows a flowchart following the flowchart of the bonding actions shown in FIG. 14.

FIG. 13 is a flowchart showing teaching actions of a wire bonding apparatus which performs wire bonding of an object to be bonded having bonding faces on a flat face in a reference orientation and on an opposing face perpendicular to the flat face. FIG. 14 is a flowchart showing bonding actions of the wire bonding apparatus which performs wire bonding of the object to be bonded having the bonding faces on the flat face in a horizontal state as the reference orientation and on the opposing face perpendicular to the flat face. FIG. 15 shows a flowchart following the flowchart of the bonding actions shown in FIG. 14. FIGS. 16A to 16H show views of positional relations between bonding points of the object to be bonded and the bonding tool in the wire bonding actions shown in FIGS. 13, 14, and 15.

Figure 16A:
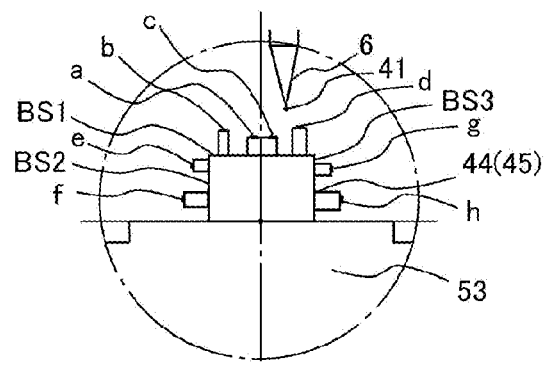
FIGS. 16A through 16H show views of positional relations between bonding points of the object to be bonded and the bonding tool in the wire bonding actions shown in FIGS. 13 and 14.

As shown in FIG. 16A, the object to be bonded (semiconductor laser package) 44 has three bonding faces BS1, BS2, and BS3 in different directions, and BS1 has the bonding points a, b, c, d. The bonding point a and the bonding point b are connected via a wire or the like, and the bonding point c and the bonding point d are connected via a wire or the like. Further, BS2 has the bonding points e, f, and the bonding point e and the bonding point f are connected via a wire or the like. BS3 has the bonding points g, h, and the bonding point g and the bonding point h are to be connected via a wire or the like.

First, for performing teaching, as shown in FIG. 16A, the semiconductor laser package 44 as the object to be bonded is mounted on the heat plate 53 and the work pressers are operated to fix the semiconductor laser package 44.

Figure 16B:
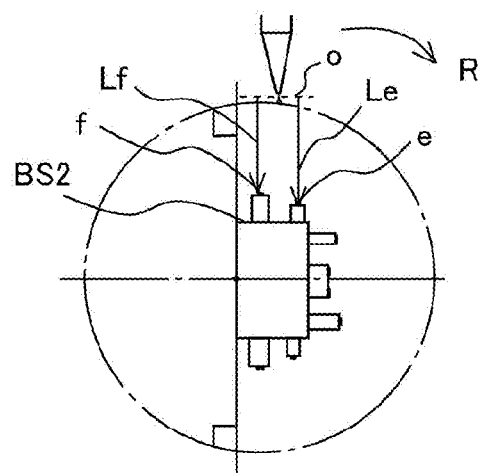

As shown in FIG. 16B, the rotation axes are rotated by 90 degrees in the R direction such that BS2 of the object to be bonded 44 comes in a horizontal state (step S40 shown in FIG. 13). The X, Y positional data and the distance data Le, Lf on the Z-axis regarding the bonding points e, f located on BS2 are inputted to be stored in the memory (step S41 shown in FIG. 13). The distance data Le is the distance from the origin o to the bonding point e, and the distance data Lf is the distance from the origin o to the bonding point f.

Information regarding the rotating direction and the rotating angle θc is acquired for correcting the difference in the separation distances of the bonding positions according to the difference in the separation distances of the bonding positions from the distance data Le, Lf of the bonding points e, f. The acquired rotating direction and the rotating angle θc are stored in the memory (step S42 shown in FIG. 13).

Figure 16C:
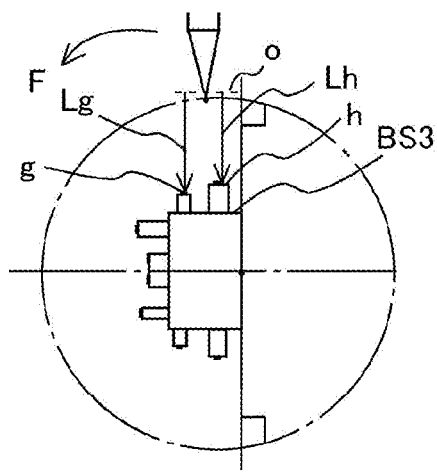

Then, as shown in FIG. 16C, the rotation axes are rotated by 180 degrees in the F direction such that BS3 of the object to be bonded 44 comes in a horizontal state (step S43 shown in FIG. 13). The X, Y positional data and the distance data Lg, Lh on the Z-axis regarding the bonding points g, h located on BS3 are inputted to be stored in the memory (step S44 shown in FIG. 13). The distance data Lg is the distance from the origin o to the bonding point g, and the distance data Lh is the distance from the origin o to the bonding point h.

Then, information regarding the rotating direction and the rotating angle θd is acquired for correcting the difference in the separation distances of the bonding positions according to the difference in the separation distances of the bonding positions from the distance data Lg, Lh of the bonding points g, h. The acquired rotating direction and the rotating angle θd are stored in the memory (step S45 shown in FIG. 13).

Figure 16D:
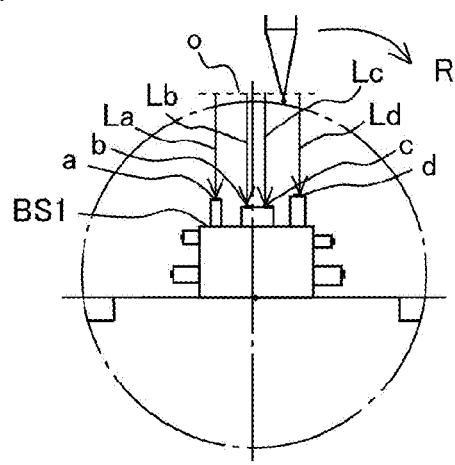

Next, as shown in FIG. 16D, the rotation axes are rotated by 90 degrees in the R direction such that BS1 of the object to be bonded 44 comes in a horizontal state that is the reference orientation (step S46 shown in FIG. 13). The X, Y positional data and the distance data La, Lb, Lc, Ld on the Z-axis regarding the bonding points a, b, c, d located on BS1 are inputted to be stored in the memory (step S47 shown in FIG. 13). The distance data La, Lb, Lc, and Ld of each of the bonding points show the distances from the origin o to each of the bonding points.

Then, information regarding the rotating direction and the rotating angle θa is acquired for correcting the difference in the separation distances of the bonding positions according to the difference in the separation distances of the bonding positions from the distance data La, Lb of the bonding points a, b. The acquired rotating direction and the rotating angle θa are stored in the memory (step S48 shown in FIG. 13).

Next, information regarding the rotating direction and the rotating angle θb is acquired for correcting the difference in the separation distances of the bonding positions according to the difference in the separation distances of the bonding positions from the distance data Lc, Ld of the bonding points c, d. The acquired rotating direction and the rotating angle θb are stored in the memory (step S49 shown in FIG. 13).

In the manner described above, the teaching actions for wire-bonding the object to be bonded having a flat face and an opposing face perpendicular to the flat face in the reference orientation are ended. The teaching actions are performed only once for the same object to be bonded.

Next, the bonding actions will be described. For performing bonding, the semiconductor laser package 44 as the object to be bonded 44 is placed on the heat plate 53 and the work pressers are operated to fix the semiconductor laser package 44.

At first, the positional data of the bonding points a, b, c, d, e, f, g, h and the distance data on the Z-axis are read out from the memory (step S60 shown in FIG. 14). Further, the data of the rotating direction and the rotating angle θc at the bonding points e, f is read out from the memory (step S61 shown in FIG. 14).

Figure 16E:
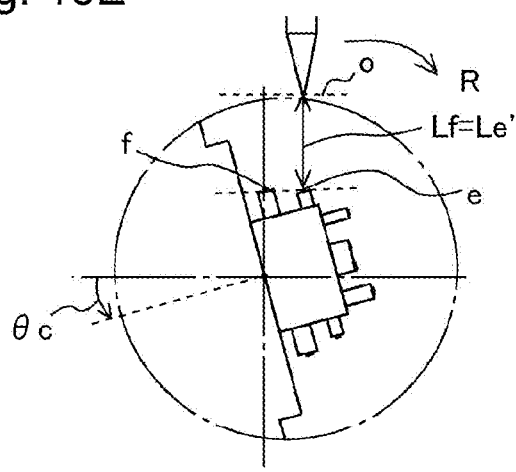

As shown in FIG. 16E, the rotation axes of the rotary mechanism unit are rotated by (90−θc) degrees in the R direction according to the read out rotating angle θc. At this time, the distance data of the bonding point e is expressed as Le'=Lf (step S62 shown in FIG. 14). Correction of the distances and the positions of the bonding points e, f after the rotation is executed, and bonding between the bonding points e, f on the second face BS2 is performed (step S63 shown in FIG. 14).

Then, the data of the rotating direction and the rotating angle θd at the bonding points g, h is read out from the memory (step S64 shown in FIG. 14).

Figure 16F:
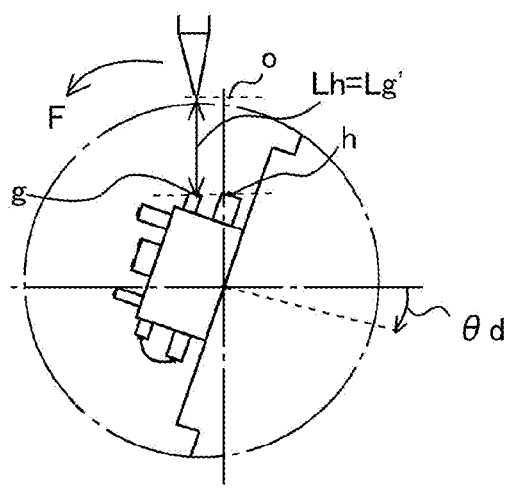

As shown in FIG. 16F, the rotation axes are rotated by (180−(θc+θd)) degrees in the F direction according to the read out rotating angle θd. At this time, the distance data of the bonding point e is expressed as Lg'=Lh (step S65 shown in FIG. 14). Correction of the distances and the positions of the bonding points g, h after the rotation is executed, and bonding between the bonding points g, h on the third face BS3 is performed (step S66 shown in FIG. 14).

Next, the data of the rotating direction and the rotating angle θa at the bonding points a, b is read out from the memory (step S67 shown in FIG. 14).

Figure 16G:
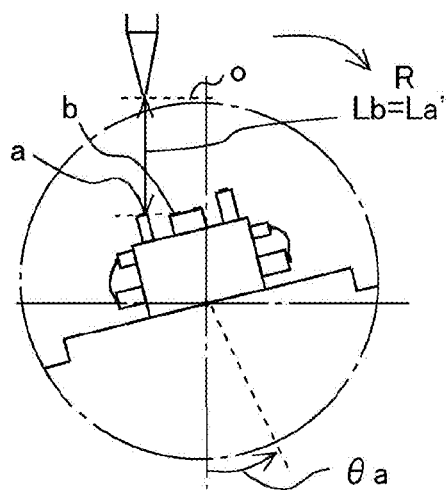
Figure 16H:
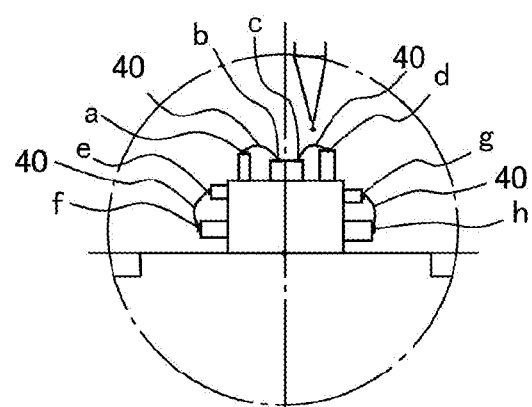

As shown in FIG. 16G, the rotation axes are rotated by (90−θd−θa) degrees in the R direction according to the read out rotating angle θa. At this time, the distance data of the bonding point a is expressed as La'=Lb (step S68 shown in FIG. 15). Correction of the distances and the positions of the bonding points a, b after the rotation is executed, and bonding between the bonding points a, b is performed (step S69 shown in FIG. 15).

Then, the data of the rotating direction and the rotating angle θb at the bonding points c, d is read out from the memory (step S70 shown in FIG. 15).

The rotation axes are rotated by (θb+θa) degrees in the R direction according to the read out rotating angle θb (not shown). At this time, the distance data of the bonding point d is expressed as Ld'=Lc (step S71 shown in FIG. 15). Correction of the distances and the positions of the bonding points c, d after the rotation is executed, and bonding between the bonding points c, d is performed (step S72 shown in FIG. 15).

In the manner described above, the bonding point a and the bonding point b as well as the bonding point c and the bonding point d on BS1 of the object to be bonded 44 having the three bonding faces BS1, BS2, and BS3 in different directions are connected via a wire or the like. Also, the bonding point e and the bonding point f on BS2 are connected via a wire or the like, and the bonding point g and the bonding point h are connected via a wire or the like.

The order of bonding is not limited. For example, the positional data is read out and the order of bonding within the face is determined based on the positional data so as not to cause interference with the already-bonded wire or the like when performing bonding within the face. For example, the order of the bonding may be determined to avoid influences upon other bonding points through determining the interference region of the bonding based on the bonding positions, a straight-line route between the two points to be bonded, the height of the wire when forming a loop, etc.

Next, described by referring to FIG. 17 and FIGS. 18A to 18C are bonding actions of an object to be bonded having a face with a tilted bonding face with respect to the reference orientation when the heat plate 53 is in the reference orientation.

Figure 17:
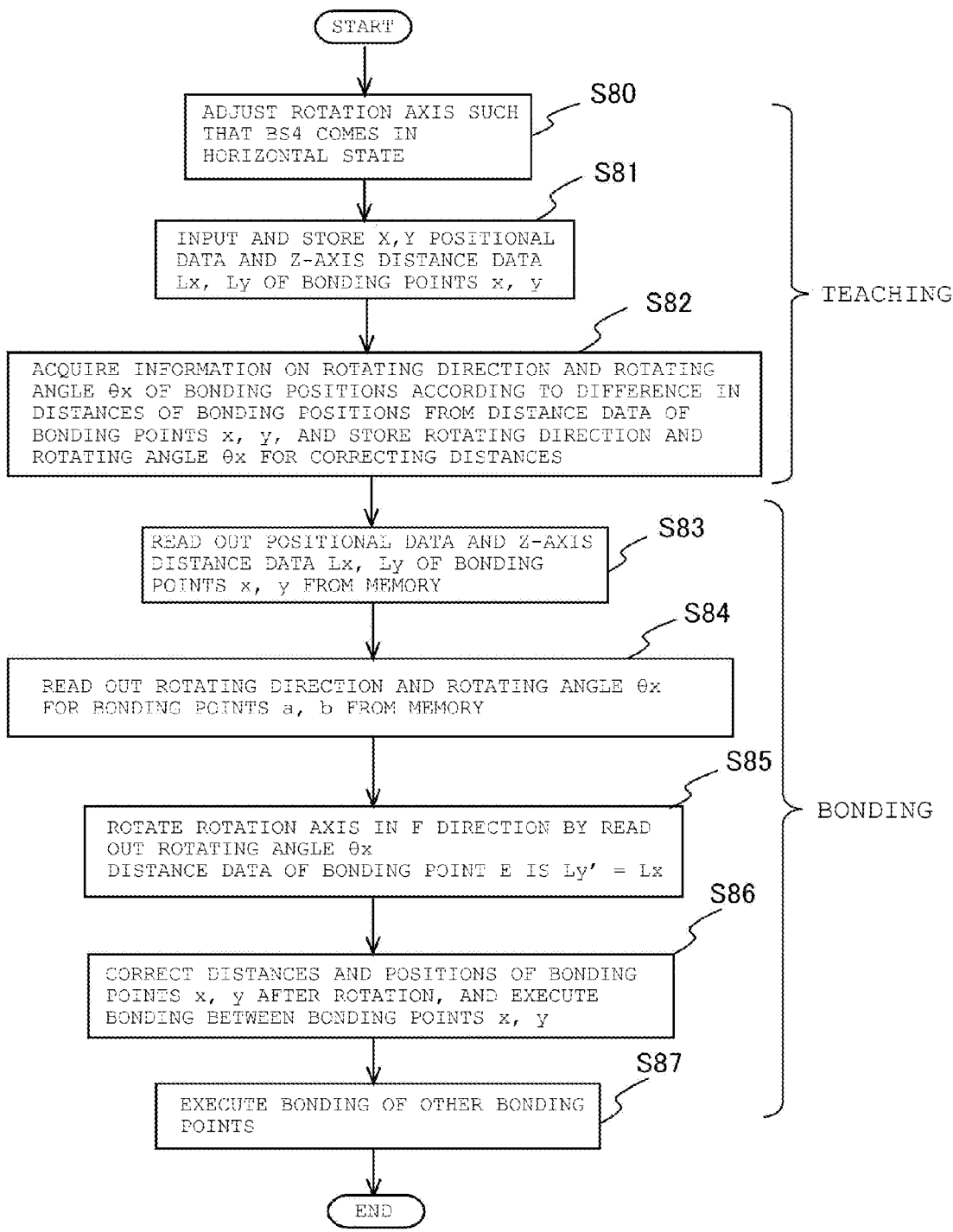
FIG. 17 shows a flowchart showing teaching and bonding actions of an object to be bonded having a tilted bonding face in a reference orientation.
Figure 18A:
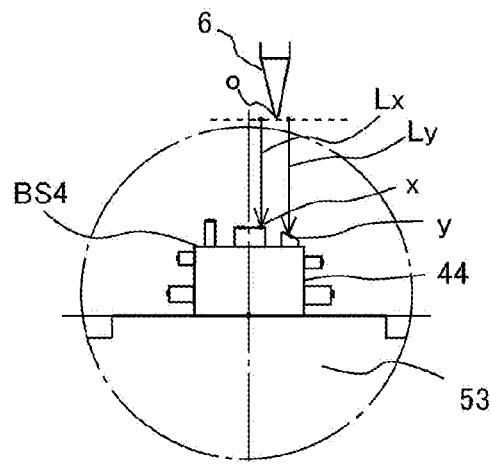
FIGS. 18A, 18B and 18C show views of positional relations between bonding points of the object to be bonded and the bonding tool in the bonding actions shown in FIG. 17.
Figure 18B:
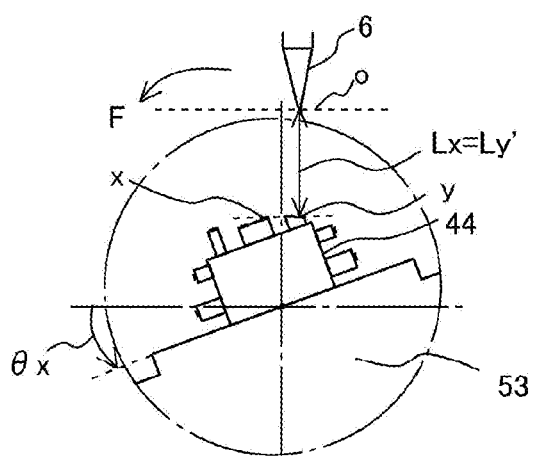
Figure 18C:
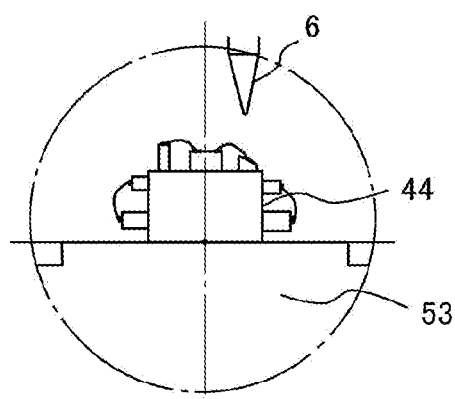

FIG. 17 shows a flowchart showing teaching and bonding actions of the object to be bonded having the tilted bonding face with respect to the reference orientation, and FIGS. 18A to 18C show views of positional relations between the bonding points of the object to be bonded and the bonding tool in the bonding actions shown in FIG. 17.

As shown in FIG. 18A, bonding points x, y of different separation distances of bonding positions are provided on a face BS4, and the surface of the bonding point y is a tilted face.

As shown in FIG. 18A, the rotation axes are adjusted such that BS4 comes in the reference orientation (step S80 shown in FIG. 17). Then, X, Y positional data and distance data Lx, Ly on the Z-axis regarding the bonding points x, y are inputted to be stored in the memory (step S81 shown in FIG. 17). The distance data Lx is the distance from the origin o to the bonding point x, and the distance data Ly is the distance from the origin o to the bonding point y.

Information regarding the rotating direction and the rotating angle θx is acquired for correcting the difference in the separation distances of the bonding positions according to the difference in the separation distances of the bonding positions from the distance data Lx, Ly of the bonding points x, y. The acquired rotating direction and the rotating angle θx are stored in the memory (step S82 shown in FIG. 17). Thereby, the teaching actions are ended.

Next, the bonding actions will be described. For performing bonding, the semiconductor laser package 44 as the object to be bonded 44 is placed on the heat plate 53 and the work pressers are operated to fix the semiconductor laser package 44.

At first, the positional data of the bonding points x, y and the distance data Lx, Ly on the Z-axis regarding the bonding points x, y are read out from the memory (step S83 shown in FIG. 17).

Then, the data of the rotating direction and the rotating angle θx at the bonding points x, y is read out from the memory (step S84 shown in FIG. 17).

Then, the rotation axes 74 are rotated by the read out rotating angle θx in the F direction. At this time, the distance data of the bonding point e is expressed as Ly'=Lx (step S85 shown in FIG. 17). Correction of the distances and the positions of the bonding points x, y after the rotation is executed, and bonding between the bonding points x, y is performed (step S86 shown in FIG. 17).

Further, as shown in FIG. 18C, bonding of the other bonding points is performed as well (step S87 shown in FIG. 17).

In the manner described above, it is possible to correct the difference in the bonding distances and perform bonding with the same distance also on the object to be bonded having the tilted bonding face with respect to the reference orientation.

The bonding apparatus according to the present invention is not limited to the wire bonding apparatus but may also be applied to a die-bonder for mounting chips to packages, a bump-bonder for forming bumps on bonding faces, and the like.

As described above, the present invention is capable of performing bonding processing on a plurality of bonding sections of different distances with respect to the reference (origin) position of the object to be bonded without changing the moving distance of the bonding means through correcting the distances of the bonding sections of the object to be bonded with respect to the bonding means by rotating the bonding stage about the rotation axes.

In the present invention, the bonding stage is rotated about the rotation axes. Thus, when performing bonding processing by the bonding means, the orientation of the bonding stage with respect to the bonding means is expected to become an issue. Therefore, the present invention utilizes the rotary mechanism unit for rotating the bonding stage to apply a torque to the bonding stage for enabling stabilization of the orientation for bonding.

Conventionally, an inversion mechanism for rotating the stage and a rotary mechanism for rotating about the axis perpendicular to the stage are required for bonding the object to be bonded having three or more bonding faces in different directions. The present invention, however, requires no such rotary mechanism for rotating about the axis perpendicular to the stage for changing the facing direction of the object to be bonded, so that the configuration of the stage can be simplified. Further, the structural components of the rotary mechanism unit 70 of the bonding apparatus according to the present invention are designed to be located on the lower side of the rotation axes 74. This provides a wide movable range for the bonding head 3.

Further, for bonding the object to be bonded having bonding faces in a flat face in a standard orientation and an opposing face perpendicular to the flat face, conventionally performed are bonding on one of the opposing faces, repositioning of the object to be bonded to a state rotated by 180 degrees by an operator, and then bonding on the other opposing face by rotating the inversion mechanism. The present invention, however, requires no such repositioning by the operator for performing bonding of the other opposing face when bonding the object to be bonded having the flat face and the opposing face perpendicular to the flat face. Therefore, the operation efficiency is improved, thereby increasing the productivity. That is, unlike the case of the conventional bonding apparatus requiring repositioning, it is possible with the present invention to achieve uniform bonding precision without paying attention to interference and the like with the already-bonded parts.

Further, unlike the case of the conventional bonding apparatus, the bonding apparatus of the present invention for bonding the object to be bonded having three or more bonding faces in different directions moves not only the bonding head but also the stage side relatively, so that stabilization of the bonding positions is required. Thus, it is necessary to set the placing position of the object to be bonded in the vicinity of the rotation axes and also to suppress vibration of the rotary mechanism unit. The bonding apparatus of the present invention applies a large torque to the rotation axes to stabilize the rotary mechanism unit and suppress vibration for enabling stable bonding. Therefore, it is possible to set the placing position of the object to be bonded in the vicinity of the rotation axes and to suppress vibration of the rotary mechanism unit.

The present invention can be embodied as a great number of forms without departing from the essential characteristics and the technical spirit thereof. It is therefore to be understood that the embodiments described above are solely provided for the explanations and that the present invention is not limited thereto.

What is claimed is:

1. A bonding apparatus, comprising:
   a bonding head configured to perform bonding operations between a first plurality of electrodes on a first surface of an object, the bonding head moving on a reference plane along an X axis and a Y axis perpendicular to each other, the bonding head moving along a Z axis for a first predetermined distance from the reference plane, the Z axis being perpendicular to the X axis and the Y axis, the first surface being parallel to the reference plane when the object is at a first initial position, the first plurality of electrodes having a first electrode and a second electrode that have different heights from the first surface of the object, the first and second electrodes having first and second bonding points thereon at positions having different heights from the first surface of the object, respectively, the first and second bonding points having first and second distances, respectively, to the reference plane along the Z axis when the object is at the first initial position, the first and second distances being different from each other, the first distance corresponding to the first predetermined distance;

a bonding stage holding the object;

a rotary mechanism configured to rotate the object on the bonding stage about a rotation axis from the first initial position, the rotation axis being parallel to the X axis;

a memory configured to store a program; and a processor configured to execute the program so as to:
move the bonding head along the Z axis by the first predetermined distance from the reference plane to perform a first bonding operation for the first bonding point when the object is at the first initial position;
obtain a first rotation angle based on a difference between the first distance and the second distance;
rotate the object on the bonding stage by a first degree as the obtained first rotation angle around the rotation axis from the first initial position, a new second distance between the second bonding point and the reference plane along the Z axis being equal to the first predetermined distance after the object on the bonding stage is rotated by the first degree from the first initial position; and
move the bonding head along the Z axis by the first predetermined distance from the reference plane to perform a second bonding operation for the second bonding point after the object on the bonding stage is rotated by the first degree from the first initial position.

2. The bonding apparatus according to claim 1, wherein the processor is configured to rotate the object on the bonding stage in forward and reverse directions about the rotation axis from the first initial position.

3. The bonding apparatus according to claim 1, wherein the bonding stage includes a heat plate configured to hold the object thereon and a heat block configured to heat the heat plate.

4. The bonding apparatus according to claim 3, wherein each of the heat plate and the heat block is monolithic.

5. The bonding apparatus according to claim 1, further comprising:
an ultrasonic transducer configured to generate an ultrasonic vibration, the ultrasonic transducer being provided in the bonding head,
wherein the rotary mechanism includes:
 a motor configured to generate a rotational force; and
 a gear configured to transfer the rotational force from the motor and rotate the object on the bonding stage around the rotation axis, and
wherein the ultrasonic vibration is suppressed by a torque generated by the motor and the gear.

6. The bonding apparatus according to claim 1, wherein the object is provided near the rotation axis.

7. The bonding apparatus according to claim 1, wherein the rotary mechanism includes:
a motor configured to generate a rotational force; and
a plurality of gears configured to transfer the rotational force from the motor and rotate the object on the bonding stage around the rotation axis, and wherein the motor and at least one gear of the plurality of gears are downwardly located from the rotation axis and at an opposite side from the bonding head with respect to the object on the bonding stage.

8. The bonding apparatus according to claim 1,
wherein the bonding head is configured to move along the Z axis for a second predetermined distance from the reference plane,
the object has a second surface perpendicular to the first surface, a second plurality of electrodes are on the second surface, the second surface is parallel to the reference plane when the object is at a second initial position, and the second plurality of electrodes have a third electrode and a fourth electrode,
the third electrode and the fourth electrode have different heights from the second surface of the object, and the third electrode and the fourth electrode have a third bonding point and a fourth bonding point thereon at positions having different heights from the second surface of the object, respectively,
the third and fourth bonding points have third and fourth distances, respectively, to the reference plane along the Z axis when the object is at the second initial position, the third and fourth distances are different from each other, and the third distance corresponds to the second predetermined distance, and
the processor is further configured to:
move the bonding head along the Z axis by the second predetermined distance from the reference plane to perform a third bonding operation for the third bonding point when the object is at the second initial position;
obtain a second rotation angle based on a difference between the third distance and the fourth distance;
rotate the object on the bonding stage by a second degree as the obtained second rotation angle around the rotation axis from the second initial position, a new fourth distance between the fourth bonding point and the reference plane along the Z axis is equal to the second predetermined distance after the object on the bonding stage is rotated by the second degree from the second initial position; and
move the bonding head along the Z axis by the second predetermined distance from the reference plane to perform a fourth bonding operation for the fourth bonding point after the object on the bonding stage is rotated by the second degree from the second initial position.

9. The bonding apparatus according to claim 8,
wherein the bonding head is configured to move along the Z axis for a third predetermined distance from the reference plane,
the object has a third surface perpendicular to the first surface and different from the second surface, a third plurality of electrodes are on the third surface, the third surface is parallel to the reference plane when the object is at a third initial position, and the third plurality of electrodes have a fifth electrode and a sixth electrode,
the fifth electrode and the sixth electrode have different heights from the third surface of the object, and the fifth electrode and the sixth electrode have a fifth bonding point and a sixth bonding point thereon at positions having different heights from the third surface of the object, respectively,
the fifth and sixth bonding points have fifth and sixth distances, respectively, to the reference plane along the Z axis when the object is at the third initial position, the fifth and sixth distances are different from each other, and the fifth distance corresponds to the third predetermined distance, and the processor is further configured to:
- move the bonding head along the Z axis by the third predetermined distance from the reference plane to perform a fifth bonding operation for the fifth bonding point when the object is at the third initial position;
- obtain a third rotation angle based on a difference between the fifth distance and the sixth distance;
- rotate the object on the bonding stage by a third degree as the obtained third rotation angle around the rotation axis from the third initial position, a new sixth distance between the sixth bonding point and the reference plane along the Z axis is equal to the third predetermined distance after the object on the bonding stage is rotated by the third degree from the third initial position; and
- move the bonding head along the Z axis by the third predetermined distance from the reference plane to perform a sixth bonding operation for the sixth bonding point after the object on the bonding stage is rotated by the third degree from the third initial position.

* * * * *